United States Patent
Royzen

(10) Patent No.: US 11,550,428 B1
(45) Date of Patent: Jan. 10, 2023

(54) MULTI-TONE WAVEFORM GENERATOR

(71) Applicant: Microsoft Technology Licensing, LLC, Redmond, WA (US)

(72) Inventor: Evgeny Royzen, Kiriyat Ono (IL)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 17/495,070

(22) Filed: Oct. 6, 2021

(51) Int. Cl.
  *G06F 3/041*     (2006.01)
  *G06F 3/044*     (2006.01)
  *H04B 1/10*      (2006.01)
  *H03M 1/66*      (2006.01)

(52) U.S. Cl.
  CPC .......... *G06F 3/04182* (2019.05); *G06F 3/044* (2013.01); *H04B 1/10* (2013.01); *H03M 1/66* (2013.01)

(58) Field of Classification Search
  CPC ...... G06F 3/0412; G06F 3/044; G06F 3/0416; G06F 3/0418; G06F 3/04182; G06F 3/04184; G06F 1/0321; G06F 11/322; H04B 1/10; H04B 1/12; H04B 15/02; G10L 21/0208; H03M 1/001; H03M 1/00; H03M 1/0617; H03M 1/08; H03M 1/0614; H03M 1/0827; H03M 1/0836; H03M 1/0845; H03M 1/0818; H03M 1/12; H03M 1/60; H04R 2460/01
  See application file for complete search history.

(56) References Cited

U.S. PATENT DOCUMENTS

| 3,526,833 | A |   | 9/1970 | Kotas |
| 6,021,388 | A | * | 2/2000 | Otsuka ..................... G10L 13/07 704/E13.01 |
| 10,613,690 | B2 | * | 4/2020 | Takahashi ........... G06F 3/04182 |
| 10,755,728 | B1 | * | 8/2020 | Ayrapetian .......... G10L 21/0272 |

(Continued)

FOREIGN PATENT DOCUMENTS

| CN | 107436618 A | * | 12/2017 | ............. G06F 1/022 |
| EP | 2463757 A1 | * | 6/2012 | ........... G06F 3/0412 |
| JP | H06113583 A |   | 4/1994 | |

(Continued)

OTHER PUBLICATIONS

Watanabe, et al., "4-bit Bipolar Triangle Voltage Waveform Generator using Single-Flux-Quantum Circuit", In Journa of Physics Procedia, vol. 65, Jan. 1, 2015, pp. 213-216.

*Primary Examiner* — Darlene M Ritchie
(74) *Attorney, Agent, or Firm* — Fiala & Weaver P.L.L.C.

(57) ABSTRACT

Systems, methods, and devices are described for generating multi-tone waveforms. A count signal having a count value is generated. A plurality of step values and a plurality of phase values are received. For each increment of the count value, an index value corresponding to each step value of the plurality of step values is calculated based on the step value, the count value, and a respective phase value of the plurality of phase values. A tone point value corresponding to each calculated index value is determined to generate a plurality of tone point values for each increment of the count value. The determined tone point values are summed to generate a corresponding waveform point for each increment of the count value. A waveform is generated as a sequence of generated waveform points.

20 Claims, 9 Drawing Sheets

(56) References Cited

U.S. PATENT DOCUMENTS

2015/0091859 A1\* 4/2015 Rosenberg .......... G06F 3/03545
345/174

FOREIGN PATENT DOCUMENTS

| JP | H08160169 | A |   | 6/1996 | | |
|----|-----------|---|---|--------|---|---|
| JP | 2526122 | Y2 |   | 2/1997 | | |
| JP | S63299799 | A |   | 12/1998 | | |
| JP | 2005164766 | A | \* | 6/2005 | ............ | H03B 28/00 |
| JP | 4451645 | B2 |   | 2/2010 | | |
| WO | WO-2022070752 | A1 | \* | 4/2022 | ............ | G06F 3/041 |

\* cited by examiner 100 kHz Tone 200 kHz Tone 300 kHz Tone

MULTI-TONE WAVEFORM GENERATOR

BACKGROUND

Waveform generators generate custom waveforms formed by multiple sine waves. These generators use input values to determine frequencies and phases and select corresponding sine waves. Some current waveform generators use an accumulator for each sine wave used to generate the waveform. Each accumulator may include sets of flip-flop circuits and adder circuits to generate respective sine waves of a desired frequency and phase. Typically, each accumulator has a large bit width to support high resolutions for determining sine waves.

BRIEF SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods, processing systems, and apparatuses are described for multi-tone waveform generation, substantially as shown in and/or described herein in connection with at least one of the figures, as set forth more completely in the claims. In one aspect, a count signal having a count value is generated. The count signal, a plurality of step values, and a plurality of phase values are received by a waveform generator. For each increment of the count value, an index value corresponding to each step value of the plurality of step values is calculated based on the step value, the count value, and a respective phase value of the plurality of phase values. A tone point value corresponding to each calculated index value is determined to generate a plurality of tone point values for each increment of the count value. The determined point values are summed to generate a corresponding waveform point for each increment of the count value. A waveform is generated as a sequence of generated waveform points.

Further features and advantages, as well as structure and operation of various examples, are described in detail below with reference to the accompanying drawings. It is noted that the ideas and techniques are not limited to the specific examples described herein. Such examples are presented herein for illustrative purposes only. Additional examples will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 1:
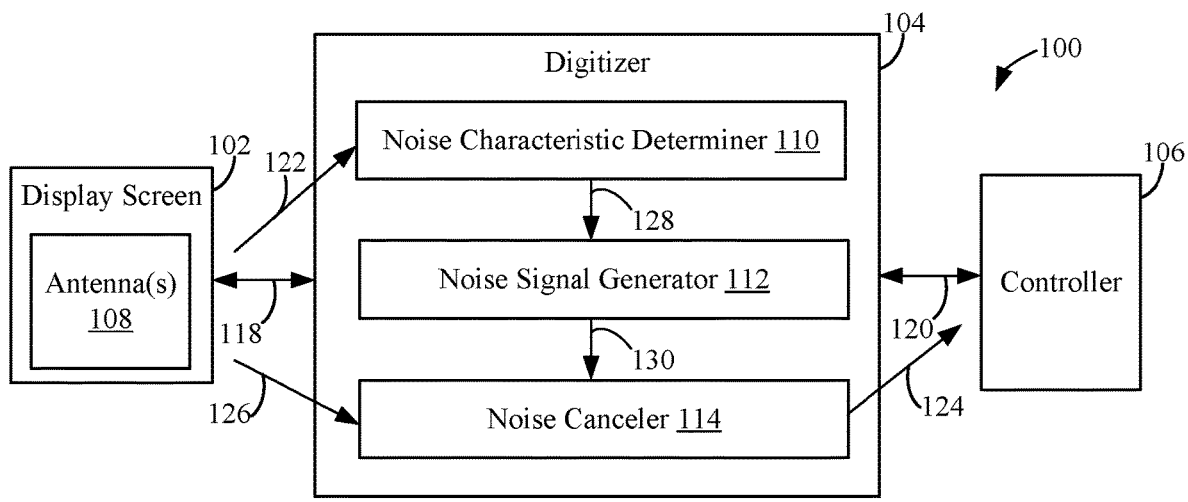
FIG. 1 is a block diagram of a device including a digitizer configured for digitizing analog signals, according to an example embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

If the performance of an operation is described herein as being "based on" one or more factors, it is to be understood that the performance of the operation may be based solely on such factor(s) or may be based on such factor(s) along with one or more additional factors. Thus, as used herein, the term "based on" should be understood to be equivalent to the term "based at least on."

It should be noted that the drawings/figures are not drawn to scale unless otherwise noted herein.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner. That is, the embodiments described herein are not mutually exclusive of each other and may be practiced and/or implemented alone, or in any combination.

II. Example Waveform Generator Embodiments

Waveform generators generate custom waveforms formed by multiple sine waves. These generators use input values to determine frequencies and phases and select corresponding sine waves. Some current waveform generators use an accumulator for each sine wave used to generate the waveform. Each accumulator may include sets of flip-flop circuits and adder circuits to generate respective sine waves of a desired frequency and phase. Typically, each accumulator has a large bit width to support high resolutions for determining sine waves. Such solutions utilize large chip areas, and their costs increase as the number of sine waves increases.

The example techniques and embodiments described herein provide for methods, devices, systems, and apparatuses for generating a multi-tone waveform. For instance, in an embodiment, a waveform generator receives step values and phase values, generates a count signal having a count value, and generates waveform points based on the step values, the phase values, and each increment of the count value. Each increment of the count value represents an increment in time. For instance, increments of the count value may represent an increment of one or more nanoseconds, microseconds, milliseconds, seconds, etc. Each step value is representative of a frequency of a tone expressed as an angular frequency measured in radians or degrees. For instance, a step value may be indicated as a decimation factor of an origin sine wave (i.e., a sine wave with an amplitude of 1, a frequency of $2\pi$, and a phase offset of 0). In this context, a higher step value indicates a higher frequency tone and a lower step value indicates a lower frequency tone. Each phase value is a phase off-set of a corresponding tone (e.g., measured in radians or degrees). Accordingly, the waveform generator generates a waveform as a sequence of the generated waveform points.

In some embodiments, the waveform generator may be further configured to receive amplitude values. In this context, the waveform generator generates waveform points based on the step values, the phase values, the amplitude values, and each increment of the count value. Each amplitude value represents the peak deviation (e.g., amplitude) a corresponding tone from an origin. Amplitude values may be represented in voltages, currents, capacitances, or other units depending on the implementation.

The example techniques and embodiments described herein may be adapted to various systems for the generation of custom waveforms, which may be used in applications such as noise characterization and cancelation. For instance, a waveform generator may be used to learn the frequency response of a channel, including determining a plurality of tones (frequencies) present in the channel. A waveform may be generated that includes the determined tones. In a noise cancelation embodiment, the generated waveform may be used to cancel noise in an analog signal. In a non-limiting example, a digitizer for a touch screen device may include a waveform generator that operates as a noise signal generator. The digitizer may receive one or more analog signals from one or more antennas. The digitizer may analyze the one or more analog signals to generate noise characteristics associated with each analog signal. The noise characteristics may be step values, phase values, and/or amplitude values associated with respective analog signals. The noise signal generator may generate a multi-tone waveform for each analog signal based on the corresponding noise characteristics. The digitizer may receive input signals from the one or more antennas and use the generated multi-tone waveforms to cancel noise from the input signals to generate noise filtered input signals.

Systems and devices may be configured in various ways for efficient multi-tone waveform generation. For example, FIG. 1 is a block diagram of a computing system 100 ("system 100" herein) configured for receiving touch interactions at a display screen, generating analog signals, converting the analog signals to digital signals, and processing the digitized signals for subsequent usage. As shown in FIG. 1, system 100 includes a display screen 102, a digitizer 104, and a controller 106. Display screen 102 includes one or more antennas 108. Digitizer 104 includes a noise characteristic determiner 110, a noise signal generator 112, and a noise canceler 114. Computing system 100 may be entirely included in a computing device such as described elsewhere herein or otherwise known, or may be spread over multiple devices. Example devices in which computing system 100 may be included include, but are not limited to, a laptop/desktop computer, a tablet computer, a handheld device, a mobile phone, a video game console, etc. The features of system 100 are described in further detail as follows.

Display screen 102 is a display screen of any suitable type including a touch display, which may be built into or physically separate from computing system 100, and/or a liquid crystal display (LCD) display, a light emitting diode (LED) display, a plasma display, or other display type. Note that display screen 102 may be a single display screen or may be comprised of multiple separate display screens. Display screen 102 may include one or more antenna(s) 108. Antenna(s) 108 may be included in one or more touch sensors of a touch-sensitive screen of display screen 102, may generate noise input signals 122 that correspond to noise on antenna(s) 108, and may generate touch input signals 126 that correspond to an amount of touch (e.g., a location/area of touch, a pressure/force of touch, etc.) by any type of touch instrument, including a pen, a stylus, or human appendage (e.g., a finger, multiple fingers, a palm, etc.).

Display screen 102 is communicatively coupled to digitizer 104 via communication link 118, which is in turn communicatively coupled to controller 106 via communication link 120. Antenna(s) 108 conduct one or more noise input signals 122 and touch input signals 126 to digitizer 104 over communication link 118. In embodiments, noise input signals 122 and touch input signals 126 may be analog signals. First communication link 118 and/or second communication link 120 may each comprise one or more physical (e.g., wires, conductive traces, etc.) and/or wireless (e.g., radio frequency, infrared, etc.) communication connections, or any combination thereof. For example, in a circuit board embodiment, communication links 118 and 120 may be conductive traces on a circuit board that antenna(s) 108, digitizer 104, and controller 106 are disposed on.

Digitizer 104 receives noise input signals 122 and touch input signals 126 from antenna(s) 108 via communication link 118 and is configured to characterize signal noise of noise input signals 122 and to cancel noise from touch input signals 126. For instance, in a noise characterization aspect, digitizer 104 receives noise input signals 122 from antenna(s) 108 at a time that touch is not applied to display screen 102, so that noise input signals 122 include signal noise inherent to antenna(s) 108. Digitizer 104 is configured to analyze noise input signals 122 to generate noise characteristic data representative of the signal noise, to generate digital noise waveform signals based on the noise characteristic data, and to convert the digital noise waveform signals to analog noise waveform signals. In a noise cancelation aspect, digitizer 104 receives touch input signals 126 from antenna(s) 108 at a time that touch is applied to display screen 102, so that touch input signals 126 include signal noise inherent to antenna(s) 108 and display screen 102 as well as touch information in touch signals generated by antenna(s) 108 related to the touch interaction with display screen 102. Digitizer 104 is configured to subtract the analog noise waveform signals from the touch input signals 126 to generate noise canceled/filtered touch signals which may be used in further downstream processing. Digitizer 104 may convert the noise canceled/filtered touch signals to digital form as digital signals 124. As shown in FIG. 1, digitizer 104 may transmit digital signals 124 to controller 106 over communication link 120.

In an embodiment, noise input signals 122 may include a noise input signal corresponding to each antenna of antenna(s) 108, and touch input signals 126 may include a touch input signal corresponding to each antenna of antenna(s) 108, and thus the aspects of noise characterization and cancelation described herein may be performed separately with respect to each antenna and each corresponding noise input signal and corresponding touch input signal.

In an embodiment, digitizer 104 may be implemented to include noise characteristic determiner 110, noise signal generator 112, and noise canceler 114 to perform the noise characterization and cancelation aspects, as described as follows. Noise characteristic determiner 110, noise signal generator 112, and noise canceler 114 may be implemented in hardware (e.g., as circuits, electrical components, etc.), software (e.g., as services, applications, etc.) and/or combinations of hardware and software, in embodiments.

Noise characteristic determiner 110 receives noise input signals 122 from antenna(s) 108 via communication link 118 and is configured to analyze noise input signals 122 to determine noise characteristics 128. For example, noise characteristic determiner 110 may determine one or more respective step values, phase values, and amplitude values for each noise input signal of noise input signals 122 (corresponding to the number of tones) as the noise characteristics for the corresponding antenna. In embodiments, noise characteristic determiner 110 may determine noise characteristics using standard signal measurement techniques as would be apparent to persons skilled in the relevant art(s). For instance, noise characteristic determiner 110 may be configured to determine the noise characteristics via a noise analysis algorithm and/or frequency response analysis algorithm (e.g., Fourier analysis). The noise characteristics corresponding to noise input signals 122 may be output by noise characteristic determiner 110 as noise characteristics 128.

As an example of determining noise characteristics, noise characteristic determiner 110 may be configured to perform a discrete Fourier transform (DFT) analysis on noise input signals 122 received from antenna(s) 108. In particular, noise characteristic determiner 110 may determine multiple tones associated with a noise input signal by using DFT techniques. In this example, for each determined tone, noise characteristic determiner 110 may determine a step value corresponding to a frequency of the determined tone, a phase value corresponding to a phase offset of the determined tone, and an amplitude value corresponding to an amplitude of the determined tone. In this context, noise characteristic determiner 110 determines noise characteristics for each determined tone associated with a noise input signal. In embodiments, for each noise input signal, noise characteristic determiner 110 may be configured to identify significant determined tones from the determined tones associated with the noise input signal. For instance, noise characteristic determiner 110 may identify determined tones as significant determined tones based on respective determined amplitude values (e.g., select tones having an amplitude greater than a predetermined value, select a predetermined number of tones having the greatest amplitude values, etc.). In this context, noise characteristic determiner 110 may output noise characteristics of significant determined tones as noise characteristics 128.

As shown in FIG. 1, noise signal generator 112 receives noise characteristics 128. Noise signal generator 112 is configured to generate a noise signal representative of noise in signals received from antenna(s) 108 (e.g., noise input signals 122 and/or touch input signals 126). In particular, noise signal generator 112 may be configured to generate a noise signal waveform from multiple tones associated with noise characteristics 128 determined by noise characteristic determiner 110 for each noise input signal. In embodiments, the noise signal waveform may be generated as a discrete waveform that is a sequence of generated waveform points.

As an example of generating a representative noise signal waveform for an antenna, noise signal generator 112 may be configured to calculate an index value corresponding to each step value and respective phase value received from noise characteristic determiner 110 related to the particular noise input signal. Noise signal generator 112 determines a tone point value corresponding to each index value (and a respective amplitude value received from noise characteristic determiner 110) to generate a plurality of tone point values for the noise input signal. In embodiments, noise signal generator 112 sums the determined plurality of tone point values to generate a corresponding waveform point for the noise input signal. In embodiments, noise signal generator 112 may store generated waveform points as digital data in one or more memory devices (not shown in FIG. 1). Noise signal generator 112 may calculate index values, determine tone point values, and generate waveform points for each iteration of a count signal having a count value that increments at a counter clock frequency. In this manner, noise signal generator 112 generates a digital noise signal for a particular input noise signal as a stream/sequence of waveform points generated across any suitable number of cycles of the counter clock frequency. The noise signal (sequence of waveform points) may be converted to analog form by noise signal generator 112. The resulting analog noise signals waveforms generated corresponding to the received noise input signals 122 may be output as analog noise signals 130.

Noise canceler 114 is configured to filter noise from an input touch signal to generate a corresponding noise filtered input signal. As shown in FIG. 1, noise canceler receives analog noise signals 132 and touch input signals 126. Noise canceler 114 is configured to filter each of touch input signals 126 received from antenna(s) 108 by subtracting the corresponding analog noise signal of analog noise signals 132 generated by noise signal generator 112 to generate a noise filtered input signal corresponding to each touch input signal of touch input signals 126. In embodiments, noise canceler 114 may perform the subtraction via digital and/or analog methods described elsewhere herein or otherwise known.

In embodiments, noise canceler 114 is configured to transmit the noise filtered input signals as digital signals 124 to controller 106. For instance, noise canceler 114 may generate the noise filtered input signals as analog noise filtered input signals corresponding to each touch input signal of touch input signals 126. In this context, noise canceler converts each analog noise filtered input signal to a digital noise filtered input signal to transmit to controller 106. In an alternative embodiment, noise canceler 114 filters noise from touch input signals 126 via digital methods to generate corresponding noise filtered input signals as digital noise filtered input signals.

Controller 106 receives digital signals 124 generated by digitizer 104 via communication link 120 and may utilize the received digital signals in any suitable manner. For example, controller 106 may interpret the digital noise filtered input signal as a user touch input to display screen 102. Controller 106 may interpret the user touch input as one or more of various inputs or actions. For instance, in a touch screen computing device, controller 106 may determine the user input indicates a request to open an application of the touch screen computing device (e.g., opening an application in a mobile device), a selection in a graphic user interface (e.g., selecting a menu option, checking a box, etc.), a text-based input (e.g., writing a text message, an e-mail, a note, etc.), a graphic input (e.g., a drawing input, a painting input, etc.), and/or any other suitable input. Controller 106 may include one or more processor circuits for executing programs for interpreting user inputs, performing actions in response to interpretations of user inputs, and other functions. Controller 106 may include one or more memory devices for storing programs (e.g., as executable program code), data files (e.g., files stored in system 100), etc. In an embodiment, controller 106 may be comprised within a system-on-chip of system 100.

Accordingly, digitizer 104 may be used in any suitable application to generate noise canceled touch signals for touch input received at a touch screen. While digitizer 104 has been described with respect to a touch screen device, it should be understood that embodiments of digitizer 104 may be implemented for noise determination and cancelation in other device types and applications.

Figure 2:
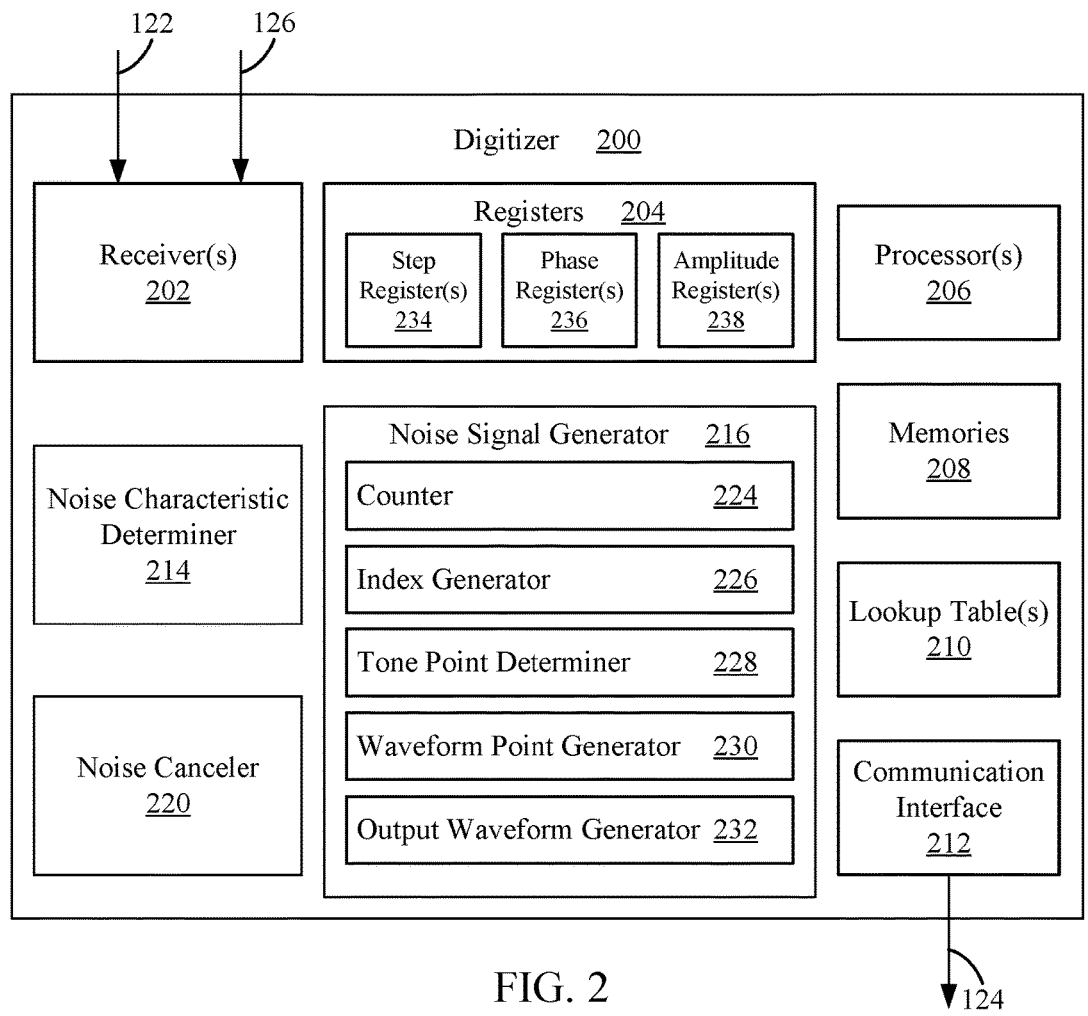
FIG. 2 is a block diagram of a digitizer configured for digitizing analog signals, according to an example embodiment.

Note that digitizer 104 of FIG. 1 may be implemented in various ways to perform its functions. For instance, FIG. 2 is a block diagram of a digitizer 200 configured for noise determination and cancelation, according to an example embodiment. Digitizer 200 is an example embodiment of digitizer 104 of system 100 in FIG. 1. Digitizer 200 is described as follows.

Digitizer 200 may be implemented in one or more computing devices, and as shown in FIG. 2, includes one or more receivers 202, one or more registers 204, one or more processor(s) 206, one or more memories/storages 208, one or more lookup table(s) 210, a communication interface 212, a noise characteristic determiner 214, a noise signal generator 216, and a noise canceler 220. The components of digitizer 200 shown in FIG. 2 are described in further detail as follows.

Receiver(s) 202 is/are configured to receive communication signals from antenna(s) 108 of FIG. 1 over communication link 118. For instance, receiver(s) 202 may receive noise input signals 122 and touch input signals 126. Receiver(s) 202 may be of any suitable receiver type mentioned elsewhere herein or otherwise known. One receiver for each antenna of antenna(s) 108 may be present in receiver(s) 202, or each receiver of receiver(s) 202 may receive signals from multiple antennas of antenna(s) 108.

Registers 204 may be any type of registers that is described herein, and/or as would be understood by a person of skill in the relevant art(s) having the benefit of this disclosure. Registers 204 may be registers of processor(s) 206. Registers 204 may include one or more registers for storing step data, phase data, and amplitude data, referred to as step register(s) 234, phase register(s) 236, and/or amplitude register(s) 238, respectively.

Processor(s) 206 and memories 208 may, respectively, include any number and type of processor circuit (e.g., central processing unit (CPU), microprocessor, multi-core processor) and memory device (e.g., random access memory (RAM), static RAM (SRAM), dynamic RAM (DRAM)) described herein and/or as would be understood by a person of skill in the relevant art(s) having the benefit of this disclosure. Processor(s) 206 and memories 208 may respectively, comprise one or more processors or memories, different types of processors or memories, etc. Processor(s) 206 may comprise circuitry configured to execute computer program instructions, such as but not limited to embodiments of noise characteristic determiner 214, noise signal generator 216, and/or noise canceler 220, which may be implemented as computer program instructions for analyzing signals, generating waveforms, and/or canceling noise. Memories 208 may be configured to store computer program instructions/code and other information and data described herein (e.g., lookup tables, thresholds, filter information, etc.). Examples of processor 204 and memory 206 may be described with respect to FIG. 13.

Lookup table(s) 210 may include, without limitation, one or more tables that store tone point values and/or tone point base values that are indexed by index values. For example, lookup table(s) 210 may map received index values (generated by index generator 226 of noise signal generator 216) to tone point values stored in lookup table(s) 210. Lookup table(s) 210 may be stored, for example, in memories 208, and may be accessed by processor 206, noise characteristic determiner 214, and/or noise signal generator 216 for the stored tone point values and/or tone point base values. Lookup table(s) 210 may be created and/or updated dynamically or may be predetermined. Embodiments of lookup table(s) 210 may reduce circuit area and/or computation time used by digitizer 200, depending on the implementation. In a non-limiting example, lookup table(s) 210 may provide for performance of a simpler and/or faster array indexing operation compared to a time intensive runtime computation of tone point values using processor and/or memory resources.

Communication interface 212 may include any type or number of wired and/or wireless communication or network adapters, modems, etc., configured to enable digitizer 200 to communicate intra-system with components thereof, as well as with other devices and/or systems over a communication link (e.g., communication link 120 shown in FIG. 1) and/or a network. For example, communication interface 212 may be used to transmit digital signals 124 to controller 106 as shown in FIGS. 1 and 2. Communication interface 212 may include hardware and/or software and may support any type of input devices, sensors, receivers, transmitters, transceivers, instruments, and/or the like that may be used for wired and/or wireless communications, as described elsewhere herein and/or as would be apparent to a person of skill in the relevant art(s) having the benefit of this disclosure.

Noise characteristic determiner 214 is an embodiment of noise characteristic determiner 110. Noise characteristic determiner 214 may be implemented as software, hardware, and/or combinations thereof, in embodiments. Noise characteristic determiner 214 is configured to receive noise input signals 122 via receiver(s) 202. Noise characteristic determiner 214 is further configured to generate noise characteristics associated with each noise input signal. For example, noise characteristic determiner 214 may be configured to generate step values, phase values, and/or amplitude values associated with each noise input signal. In embodiments, noise characteristic determiner 214 may generate multiple step values, phase values, and/or amplitude values for a corresponding noise input signal. In this context, each step value, phase value, and amplitude value correspond to a tone of the corresponding noise input signal. According to an embodiment, noise characteristic determiner 214 may store determined noise characteristics in registers 204. For instance, step values may be stored in step register(s) 234, phase values may be stored in phase register(s) 236, and amplitude values may be stored in amplitude register(s) 238, in embodiments. In embodiments, noise characteristic determiner 214 may receive noise input signals 122 from receiver(s) 202 as digital data, analog signals, or a mix of digital and analog data.

Noise signal generator 216 is an embodiment of noise signal generator 112 of FIG. 1. As shown in FIG. 2, noise signal generator 216 includes a counter 224, an index generator 226, a tone point determiner 228, a waveform point generator 230, and an output waveform generator 232, each of which may be implemented as hardware or software/firmware executed by hardware in embodiments. These features of noise signal generator 216 are described in further detail as follows.

Counter 224 is configured to generate a count signal having a count value. For example, counter 224 may include a sequential digital logic circuit with an input line called the clock and multiple output lines. The value on the output lines may represent a number in the binary or BCD (binary coded decimal) number systems, for example. Each pulse applied to the clock input causes the sequential digital logic circuit to increment or decrement the value on the output lines. In embodiments, the count value may be incremented at a set frequency, e.g., a counter clock frequency. The count value may be periodically reset, for example, when a pre-determined maximum count value is reached. The pre-determined maximum count value may be stored in memories 208. In one example embodiment, the pre-determined maximum count value may be set by controller 106 or a user.

Index generator 226 is configured to generate an index value based on a count value, a step value, and a phase value. For example, index generator 226 receives the count value from counter 224, a step value from step register(s) 234, and a phase value from phase register(s) 236 and generates an index value. In this way, for each step value, index generator 226 calculates an index value based on the step value, the count value, and a respective phase value. In embodiments, the next step value and respective phase value may be received at a set frequency, e.g., a value clock frequency. In embodiments, index generator 226 calculates index values for each step value for each increment of the count value. For example, if four step values are stored in step register(s) 234, index generator 226 may calculate an index value based on each of the four step values and respective phase values for each increment of the count value. In embodiments, index generator 226 may be a circuit that generates calculated index values as an index signal (a numerical index value). For example, index generator 226 may generate the index signal as a multi-bit digital signal or an analog signal, in embodiments.

Index generator 226 may be configured to calculate index values in various ways. For instance, in an embodiment, index generator 226 is configured to calculate an index value according to Equation 1 as follows:

$$\text{Index}(k) = (\text{Count}(i) * \text{Step}(k) + \text{Phase}(k)) \quad \text{(Equation 1)}$$

In Equation 1, k is a tone, Index(k) is the index value, Count(i) is the count value received from counter 224 at an increment i, Step(k) is the step value received from step register(s) 234, and Phase(k) is the phase value received from phase register(s) 236 corresponding to Step(k). In this way, the index value for tone k at increment i may be calculated as a sum of the step product value, the product of Count(i) and Step(k), and the phase value for the tone, Phase(k).

Tone point determiner 228 is configured to receive a calculated index value from index generator 226 for each step value and determine a tone point value for each step value. For each calculated index value, tone point determiner 228 determines a tone point value by applying the calculated index value received from index generator 226 as an index to lookup table(s) 210. In some embodiments, tone point determiner 228 may determine a tone point base value by applying the calculated index value to lookup table(s) 210. In this context, tone point determiner 228 may multiply the tone point base value by a respective amplitude value to determine the tone point value. As such, lookup table(s) 210 may be configured to store point values of tones with a normalized amplitude (e.g., an amplitude of 1), which enables lookup table(s) 210 to be reduced in size, allowing for less memory consumption and/or a faster array indexing operation. In embodiments, tone point determiner 228 may be a circuit that generates determined tone point values as a tone point signal. For example, tone point determiner 228 may generate the tone point signal as a multi-bit digital signal or an analog signal, in embodiments.

Waveform point generator 230 is configured to receive a determined tone point value for each step value from tone point determiner 228 and generate a waveform point for each increment of the count value. In accordance with an embodiment, for each increment of the count value, waveform point generator 230 sums the determined tone point values received from tone point determiner 228 to generate a waveform point. In this context, waveform point generator 230 may use the same logic circuits (e.g., demultiplexer, adder) to generate waveform points for each increment of the count value, which may reduce circuit area. In embodiments, waveform point generator 230 may be a circuit that generates waveform points as a waveform point signal. For example, waveform point generator 230 may generate the waveform point signal as a multi-bit digital signal or an analog signal, in embodiments.

Output waveform generator 232 is configured to receive generated waveform points from waveform point generator 230 and generate a noise signal (e.g., as a waveform) as a sequence of the generated waveform points. In a non-limiting example, output waveform generator 232 may receive generated waveform points from waveform point generator 230 as multi-bit digital signals and include a DAC for converting the generated waveform points to analog waveform points. In another non-limiting example, output waveform generator 232 may receive generated waveform points from waveform point generator 230 as analog signals and include an ADC for converting generated waveform points to one or more digital signals. In some embodiments, output waveform generator 232 may store generated waveform points in memories 208 (e.g., as digital data).

Noise canceler 220 is a further embodiment of noise canceler 114. Noise canceler 220 may be implemented as software, hardware, and/or combinations thereof, in embodiments. Noise canceler 220 is configured to filter noise from touch input signals (e.g., touch input signals 126). For example, noise canceler 220 may be configured to receive a touch input signal of touch input signals 126 from receiver(s) 202 and filter noise from the touch input signal to generate a noise filtered input signal. The noise filtering processes of noise canceler 220 may be implemented in various ways. For example, noise canceler 220 may receive a noise signal from noise signal generator 216 and filter noise using the noise signal. Noise canceler 220 may filter noise using analog or digital noise filtering processes to generate the noise filtered input signal. In this context, noise canceler 220 may include one or more digital-to-analog converters (DACs) and/or analog-to-digital converters (ADCs) for converting received signals for use in analog and/or digital noise filtering processes. For instance, in a non-limiting example, noise canceler 220 may receive an input signal from receiver(s) 202 as an analog signal and receive a noise signal from noise signal generator 216 as digital data. In this context, noise canceler 220 converts the noise signal to an analog noise signal (e.g., via an ADC). Noise canceler 220 subtracts the analog noise signal from the input signal received from receiver(s) 202 (e.g., via an analog signal subtraction method) to generate the noise filtered input signal.

In embodiments, noise canceler 220 is further configured to convert the noise filtered input signal for further processing by digitizer 200 and/or for communicating to an external device (e.g., controller 106 shown in FIG. 1). In an embodiment, noise canceler 220 may include an ADC for converting the noise filtered input signal to a digital noise filtered input signal. For instance, noise canceler 220 may generate the noise filtered input signal as an analog signal via an analog signal subtraction method and convert the analog signal to a digital noise filtered input signal for further processing by digitizer 200 and/or for communicating to an external device, such as controller 106 shown in FIG. 1.

Figure 11:
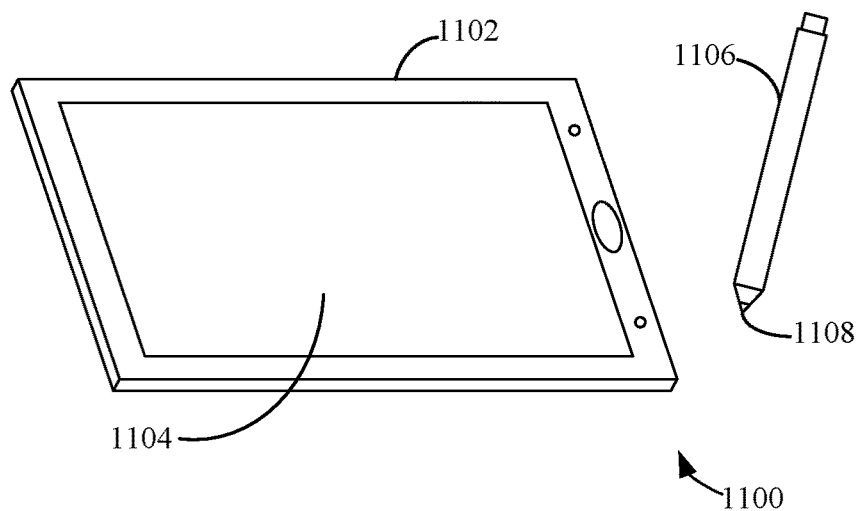
FIG. 11 depicts a computing device including a touch screen panel and a stylus suitable for use with the computing device, according to an example embodiment.

Digitizer 200 may include additional components (not shown for brevity and illustrative clarity) including, but not limited to, components and subcomponents of other devices and/or systems herein (e.g., display screen 102 shown in FIG. 1), as well as those described below with respect to FIGS. 7-9 and/or FIGS. 11-13, including software such as an operating system (OS), according to embodiments.

Figure 3A:
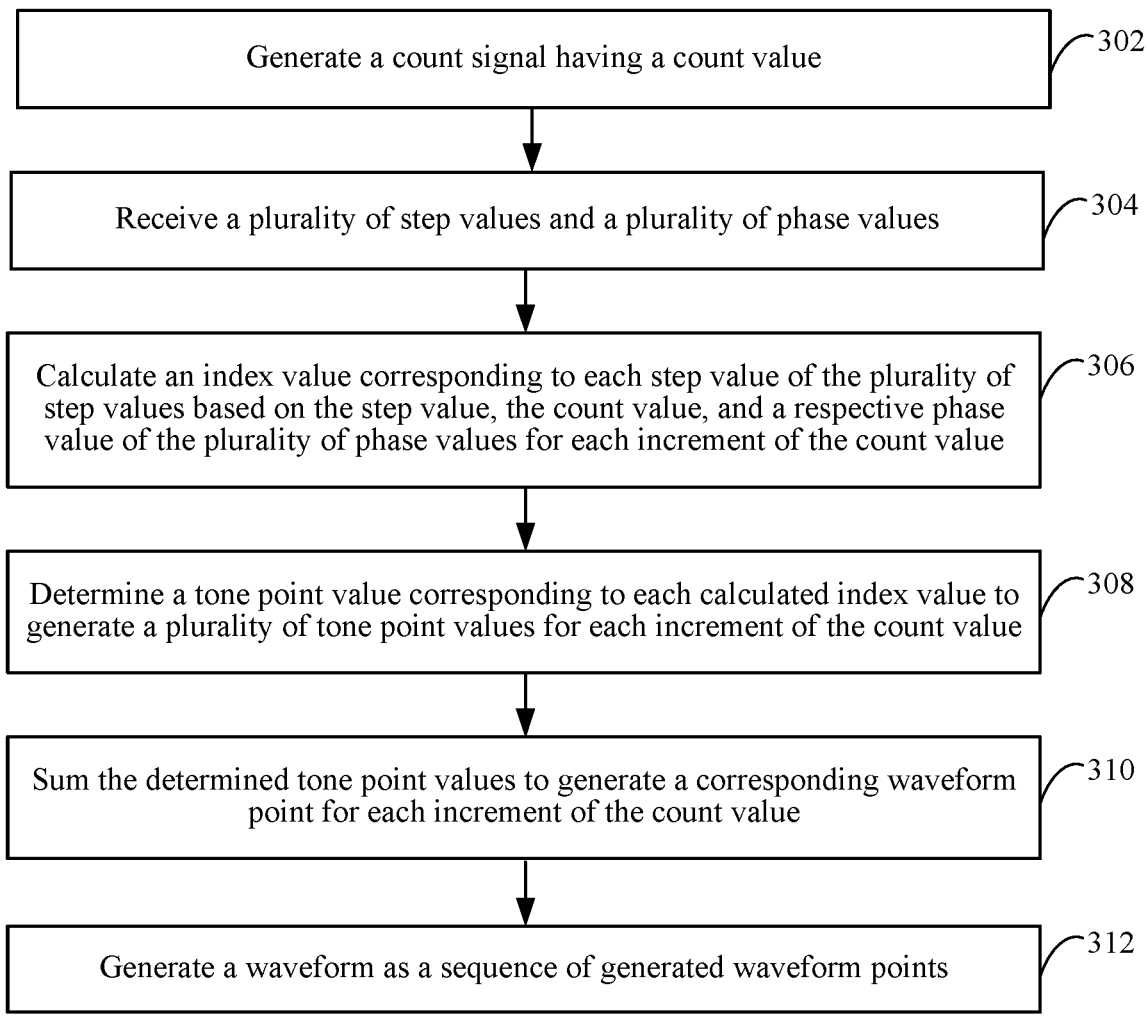
FIG. 3A is a flowchart providing a process for generating a multi-tone waveform, according to an example embodiment.

Noise signal generator 216 of digitizer 200 may operate in various ways in embodiments. For instance, FIG. 3A shows a flowchart 300 for efficient multi-tone waveform generation, according to an example embodiment. In an embodiment, noise signal generator 216 may perform flowchart 300. Flowchart 300 is described as follows with respect to system 100 of FIG. 1 and digitizer 200 of FIG. 2. Further structural and operational embodiments will be apparent to persons skilled in the relevant art(s) based on the following description. Note that not all steps of flowchart 300 need be performed in all embodiments.

Flowchart 300 starts at step 302. In step 302, a count signal having a count value is generated. For example, counter 224 as shown in FIG. 2 generates a count signal having a count value. In embodiments, the count value may increment at a set frequency, e.g., a counter clock frequency. The count value may be periodically reset, for example, when a pre-determined maximum count value is reached.

In step 304, a plurality of step values and a plurality of phase values are received. For example, index generator 226 may receive a plurality of step values and/or a plurality of phase values from noise characteristic determiner 214 and/or respective registers of registers 204 (e.g., step register(s) 234 and phase register(s) 236). In accordance with an embodiment, each step value and a respective phase value may be received at a set frequency, e.g., a value clock frequency. The value of the clock frequency is proportional to the counter clock frequency, in embodiments. For instance, the counter clock frequency may be lower than the value clock frequency by an amount proportionate to the number of step values in the plurality of step values. For example, in an embodiment, there are four step values in the plurality of step values. In this case, the counter clock frequency is four times slower than the value of the clock frequency. As a running example, each step value and respective phase value corresponds to a tone of a multi-tone waveform.

In step 306, an index value corresponding to each step value of the plurality of step values is calculated based on the step value, the count value, and a respective phase value of the plurality of phase values. For example, index generator 226 may calculate an index value corresponding to each step value received in step 304 based on the step value, the count value, and a respective phase value of the plurality of phase values. In embodiments, index values may be calculated using Equation 1 as described with respect to FIG. 2 above. In a non-limiting example, the multiplier is a multiplier and accumulator for performing a fast Fourier transform (FFT) algorithm based on the step value, the count value, and the respective phase value. Continuing the running example mentioned with respect to step 304, each calculated index value may correspond to a respective tone of the multi-tone waveform, and is calculated based on the step value and phase value determined for the tone and the current count value.

In step 308, a tone point value corresponding to each calculated index value is determined to generate a plurality of tone point values. For example, tone point determiner 228 may determine a tone point value corresponding to each index value calculated by index generator 226 to generate a plurality of tone point values. According to an embodiment, tone point determiner 228 may determine a tone point value by comparing an index value against a lookup table, e.g., lookup table(s) 210. Continuing the running example mentioned above with respect to steps 304 and 306, each determined tone point value corresponds to a point of a respective tone of the multi-tone waveform at a time corresponding to the increment of count and may be determined by looking up the tone point value based on the index value determined for the tone, and scaled by the amplitude value determined for the tone. Determining a tone point value for each calculated index value enables creation of a robust tone waveform formed of a sufficient number of tone points.

In step 310, the determined tone point values are summed to generate a corresponding waveform point. For example, waveform point generator 230 may sum the tone point values determined by tone point determiner 228 to generate a corresponding waveform point. Continuing the running example mentioned above with respect to steps 304-308, each determined tone point value for a noise input signal may be summed to generate a corresponding waveform point for a construction of the noise signal. In this context, the corresponding waveform point represents a point on the multi-tone waveform at a time corresponding to the increment of count. For instance, if the multi-tone waveform is represented by four tones, four tone point values may be determined in step 308 and summed in step 310 to generate the corresponding waveform point.

Note that steps 306-310 may be performed for each increment of the count value. In this way, waveform generators such as noise signal generator 216 may use the same logic circuits (e.g., multiplexors, adders, etc.) to generate waveform points for each increment of the count, thus reducing circuit area and/or costs.

In step 312, a waveform is generated as a sequence of the generated waveform points. For example, output waveform generator 232 receives waveform points generated by waveform point generator 230 and generates a waveform (e.g., a noise signal) as a sequence of the generated waveform points. In some embodiments, output waveform generator 232 may convert waveform points to digital data. Note that step 312 may be performed during an iteration of flowchart 300.

Figure 3B:
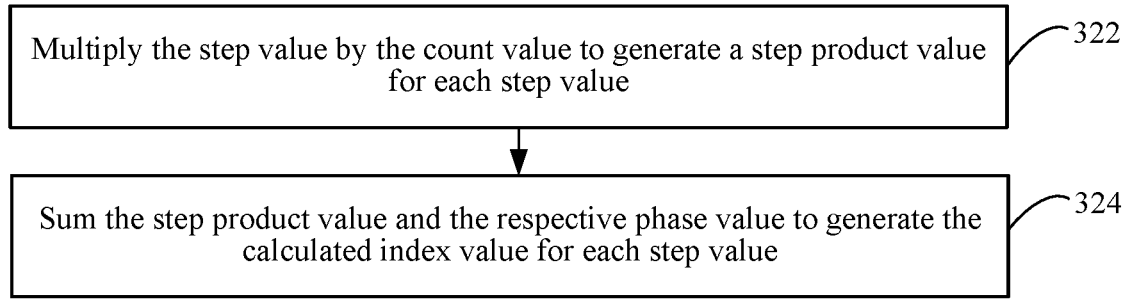
FIG. 3B is a flowchart providing a process for calculating index values, according to an example embodiment.

Note that in embodiments, step 306 may be performed in various ways. For instance, FIG. 3B shows a flowchart 320 providing a process for calculating index values, according to an example embodiment. In an embodiment, flowchart 320 is an example process for step 306 of FIG. 3A, and index generator 226 may be configured to perform flowchart 320. In an embodiment, flowchart 320 may describe performing step 306 using Equation 1 as described with respect to FIG. 2 above. Flowchart 320 is described as follows with respect to digitizer 200 of FIG. 2. Further structural and operational embodiments will be apparent to persons skilled in the relevant art(s) based on the following description.

Flowchart 320 starts at step 322. In step 322, for each step value, the step value is multiplied by the count value to generate a corresponding step product value. For example, index generator 226 may include a multiplier that multiplies the step value by the count value to generate a corresponding step product value. In embodiments, the same multiplier may be used to generate each step product value. For example, the multiplier of index generator 226 may multiply the step value by the count value to generate the step product value for each cycle of the value clock frequency. In this context, using a common index generator, such as index generator 226, instead of an index generator for each tone, reduces circuit elements, circuit area, and/or cost.

In step 324, for each step value, the step product value and the respective phase value are summed to generate the calculated index value. For example, index generator 226 may include an adder that adds the respective phase value to the step product value generated in step 322 to generate the index value. In embodiments, the same adder may be used to generate each calculated index value. For example, the adder of index generator 226 may sum the step product value and the phase value to generate the index value for each cycle of the value clock frequency. In this context, index generators such as index generator 226 may be used to reduce circuit area and/or cost.

Figure 3C:
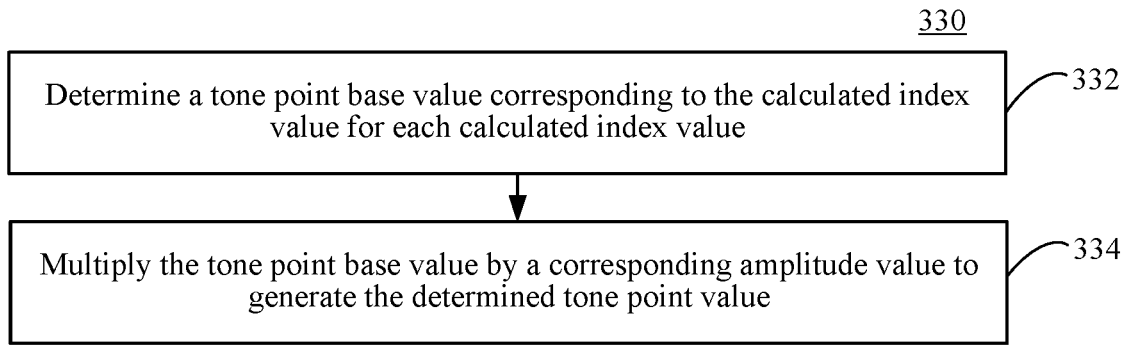
FIG. 3C is a flowchart providing a process for determining tone point values, according to an example embodiment.

Note that in embodiments, step 308 may be performed in various ways. For instance, FIG. 3C shows a flowchart 330 providing a process for determining tone point values, according to an example embodiment. In an embodiment, flowchart 330 is an example process for step 308 of FIG. 3A, and tone point determiner 228 may be configured to perform flowchart 330. Flowchart 330 is described as follows with respect to digitizer 200 of FIG. 2. Further structural and operational embodiments will be apparent to persons skilled in the relevant art(s) based on the following description.

Flowchart 330 starts at step 332. In step 332, for each calculated index value, a tone point base value corresponding to the calculated index value is determined. For example, tone point determiner 228 may determine a tone point base value corresponding to the index value calculated by index generator 226 for each index value. According to an embodiment, tone point determiner 228 determines a tone point base value by applying an index value to a lookup table, e.g., lookup table(s) 210. In embodiments, tone point base values may have a normalized amplitude, e.g., an amplitude of 1. In this context, a common set of one or more lookup tables (lookup table(s) 210) may be used for determining tone point values for all tones, rather than using separate lookup table(s) corresponding to each tone, thereby reducing circuit area and elements, and enabling a faster array index operation to be performed relative to runtime calculation of tone point values.

In step 334, for each calculated index value, the tone point base value is multiplied by a corresponding amplitude value to generate the determined tone point value. For example, tone point determiner 228 may multiply the tone point base value determined in step 332 by an amplitude value to generate the determined tone point value. In embodiments, each amplitude value may correspond to respective step and phase values received in step 304. For instance, tone point determiner 228 may receive a plurality of amplitude values from noise characteristic determiner 214 and/or amplitude register(s) 238. In accordance with an embodiment, each amplitude value may be received every cycle of the value clock frequency. In this context, tone point determiner 228 generates the determined tone point value for each cycle of the value clock frequency by summing the tone point base value and the amplitude value received during that cycle.

Figure 4:
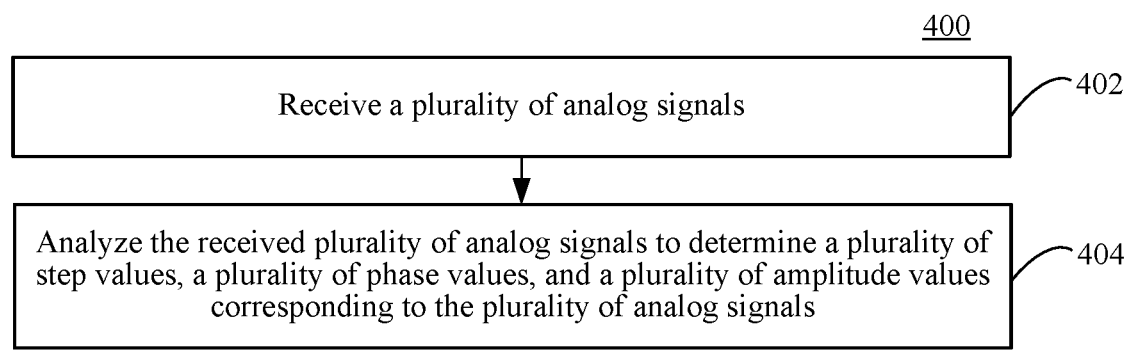
FIG. 4 is a flowchart providing a process for analyzing analog signals, according to an example embodiment.

As described above, noise characteristics (e.g., step values, phase values, and/or amplitude values) may be determined (e.g., by noise characteristic determiner 214 of FIG. 2), which may be performed in various ways. For instance, FIG. 4 shows a flowchart 400 for determining step values, phase values, and amplitude values, according to an example embodiment. Flowchart 400 is described as follows with respect to FIGS. 1-3. Note that not all steps of flowchart 400 need to be performed in all embodiments.

Flowchart 400 starts at step 402, which may be performed prior to steps 302 or 304 of flowchart 300 in FIG. 3A. In step 402, a plurality of analog signals is received. For example, noise characteristic determiner 214 may receive analog signals from receiver(s) 202. In embodiments, the analog signals received from receiver(s) 202 may correspond to noise input signals (e.g., noise input signals 122) received by antennas (e.g., antenna(s) 108). In embodiments, the analog signals may represent one or more signals from one or more antennas (e.g., antennas 108). As a non-limiting example, the analog signals may represent signals on antennas of a touch screen device when no touch input is detected. In this context, noise characteristic determiner 214 may identify the analog signals as noise input signals (due to touch-related signal being absent). In some embodiments, the plurality of analog signals may be received as a combined analog signal representing a combination (e.g., a sum) of the plurality of analog signals.

In step 404, the plurality of analog signals is analyzed to determine a plurality of step values, a plurality of phase values, and a plurality of amplitude values corresponding to the plurality of analog signals. For example, noise characteristic determiner 214 may analyze the analog signals received in step 402 to determine a plurality of step values, a plurality of phase values, and/or a plurality of amplitude values corresponding to the analog signals. In embodiments, noise characteristic determiner 214 may determine a plurality of step values, a plurality of phase values, and/or a plurality of amplitude values for each analog signal. In embodiments, the step, phase, and/or amplitude values may be determined using standard signal measurement techniques as would be apparent to persons skilled in the relevant art(s), including techniques of Fourier analysis. For instance, in a digitizer that generates waveforms to filter noise from an input signal, a noise analysis algorithm may be used to determine the step, phase, and/or amplitude values corresponding to the analog signals (e.g., noise input signals 122). In an embodiment, noise characteristic determiner 214 may store step values in step register(s) 234, phase values in phase register(s) 236, and amplitude values in amplitude register(s) 238.

Figure 5:
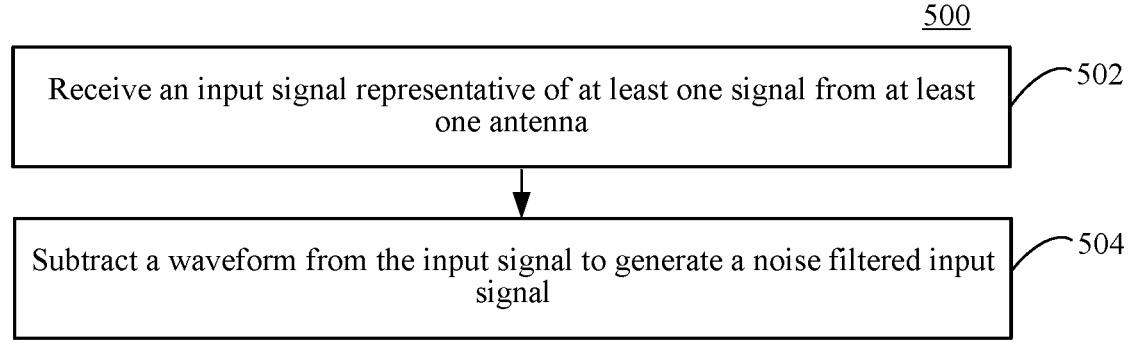
FIG. 5 is a flowchart providing a process for filtering noise from an input signal, according to an example embodiment.

As described above, generated waveforms may be used to filter noise on one or more antennas. For instance, FIG. 5 shows flowchart 500 for filtering noise from an input signal, according to an example embodiment. Flowchart 500 is described as follows with respect to FIGS. 1-3. Note that not all steps of flowchart 500 need to be performed in all embodiments.

Flowchart 500 starts at step 502, which may be performed subsequent to step 312 of flowchart 300 in FIG. 3. In step 502, an input signal (e.g., a touch input signal) representative of at least one signal from at least one antenna is received. For example, noise canceler 220 may receive an input signal from receiver(s) 202. In embodiments, the input signal may be representative of a touch input signal (e.g., a touch input signal of touch input signals 126) received by receiver(s) 202 from an antenna (e.g., an antenna of antennas 108). In a non-limiting example embodiment, the input signal may represent a touch input sensed by a touch sensor, e.g., a capacitive touch sensor of a touch screen device.

In step 504, a waveform is subtracted from the input signal to generate a noise filtered input signal. For example, noise canceler 220 may subtract a waveform generated by noise signal generator 216 (e.g., a noise signal) from the input signal received in step 502 to generate a noise filtered input signal. In accordance with an embodiment, noise signal generator 216 may generate the waveform according to one or more steps of flowchart 300. In this context, the waveform may represent noise in an antenna (e.g., an antenna of antennas 108) associated with the input signal as a noise waveform. Noise canceler 220 may filter noise from an input signal (e.g., the input signal received in step 502) by subtracting the noise waveform from the input signal to generate the noise filtered input signal. Noise canceler 220 may subtract the noise waveform from the input signal using analog or digital subtraction methods to generate the noise filtered input signal. In embodiments, noise canceler 220 may convert the noise filtered input signal to a digital noise filtered input signal and transmit the digital noise filtered input signal to a controller (e.g., controller 106) via communication interface 212.

Figure 6:
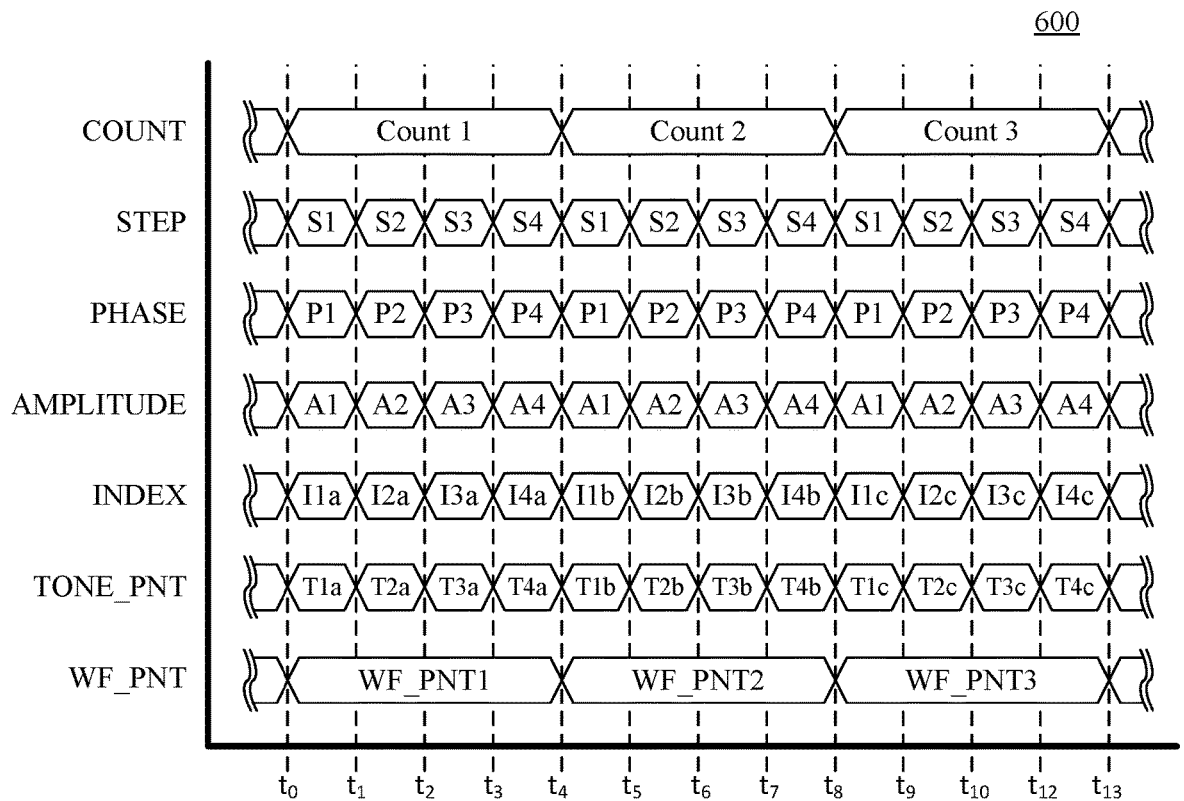
FIG. 6 is a timing diagram of signals that illustrates techniques for generating a multi-tone waveform, according to an example embodiment.

In embodiments, signals may be processed, and values may be calculated in various ways. For instance, FIG. 6 shows a timing diagram 600 of signals that illustrates techniques for generating a multi-tone waveform, according to an example embodiment. In an embodiment, digitizer 200 may generate signals shown in timing diagram 600. Timing diagram is described as follows with respect to digitizer 200 of FIG. 2. Further structural and operational embodiments will be apparent to persons skilled in the relevant art(s) based on the following description. Note that not all signals shown in timing diagram 600 may be generated and/or used in all embodiments.

In timing diagram 600, the horizontal axis represents time in microseconds. Timing diagram 600 includes a count signal labeled "COUNT" having a count value, a step signal labeled "STEP" having a step value, a phase signal labeled "PHASE" having a phase value, an amplitude signal labeled "AMPLITUDE" having an amplitude value, an index signal labeled "INDEX" having an index value, a tone point signal labeled "TONE_PNT" having a tone point base value, and a waveform point signal labeled "WF_PNT" having a value representative of a waveform point. The horizontal axis is broken into time intervals between time points $t_0$-$t_{13}$. In an example embodiment, time intervals are equidistant.

The operation shown in FIG. 6 is illustrated with respect to an example embodiment for generating a waveform from four tones. The operation begins at to with COUNT having a first value labeled "COUNT 1". As described elsewhere herein, counter 224 may increment COUNT according to a counter clock frequency. In this context, the time between $t_0$ and $t_4$ represents a first cycle of the counter clock frequency. As described elsewhere herein, STEP, PHASE, and AMPLITUDE may alternate values at a value clock frequency proportional to the counter clock frequency. In the example shown in FIG. 6, the value clock frequency is four times faster than the counter clock frequency. For instance, the time between to and $t_1$ represents a first cycle of the value clock frequency. As illustrated in FIG. 6, STEP sequences through step values labeled "S1", "S2", "S3", and "S4", PHASE sequences through phase values labeled "P1", "P2", "P3", and "P4", and AMPLITUDE sequences through amplitude values labeled "A1", "A2", "A3", and "A4". In this context, S1, P1, and A1 correspond to a first tone, S2, P2, and A2 correspond to a second tone, S3, P3, and A3 correspond to a third tone, and S4, P4, and A4 correspond to a fourth tone. In this way, digitizer 200 may use the same logic circuits to calculate index values of INDEX and determine tone point values of TONE_PNT for each tone.

The operation shown in FIG. 6 further shows INDEX having an index value that is calculated every cycle of the value clock frequency. In this context, the index value is calculated with respect to the current values of COUNT, STEP, and PHASE for that cycle of the value clock frequency. For example, from $t_0$ to $t_1$, index generator 226 may calculate a first index value labeled "I1a" based on COUNT 1, S1, and P1. In this way, for each increment of the count value of COUNT, index generator 226 may calculate an index value for each step value of STEP and respective phase value of PHASE.

The operation shown in FIG. 6 further shows TONE_PNT having a tone point value that is determined every cycle of the value clock frequency. In this context, the tone point value is determined with respect to the value of INDEX for each cycle of the value clock frequency. For example, from $t_0$ to $t_1$, tone point determiner 228 determines a first tone point value labeled "T1a" based on I1a. According to an embodiment, tone point determiner 228 determines T1a by comparing I1a to a lookup table of lookup table(s) 210. According to another embodiment, tone point determiner 228 determines T1a by comparing I1a to a lookup table of lookup table(s) 210 to determine a tone point base value, and summing the determined tone point base value and A1 to generate T1a.

The operation shown in FIG. 6 further shows WF_PNT having a value that changes with respect to the counter clock frequency. For example, waveform point generator 230 generates WF_PNT by summing the values of TONE_PNT during an increment of COUNT. For instance, when COUNT is at COUNT 1, waveform point generator 230 sums each value of TONE_PNT at each cycle of the value clock frequency between $t_0$ and $t_4$ to generate a first waveform point labeled "WF_PNT1". According to an embodiment, waveform point generator 230 may update the value of WF_PNT1 at each cycle of the value clock frequency when COUNT is at COUNT 1. In this context, waveform point generator 230 may generate WF_PNT1 after tone point value T4a is added during the cycle of the value clock frequency between $t_3$ and $t_4$. In an example embodiment, output waveform generator 232 samples WF_PNT after all tone point values determined in a cycle of the counter clock frequency are summed by waveform point generator 230 to receive the waveform point for the corresponding increment of COUNT.

The operations described above with respect to FIG. 6 may repeat for multiple increments of COUNT, e.g., count values labeled "COUNT 2" and "COUNT 3" as illustrated in FIG. 6. It is contemplated that any number of increments of COUNT may be used depending on the desired resolution of the waveform generated by noise signal generator 216. For example, counter 224 may increment COUNT less than 10 times, in the 10 s of times, in the hundreds of times, in the thousands of times, or even a greater number of times, depending on the particular implementation. In a non-limiting example embodiment, counter 224 is a 32-bit counter that counts up to a 32-bit unsigned integer. Furthermore, COUNT may be reset either by a reset signal, a reset clock signal, a signal generated by a component or subcomponent of digitizer 200, a signal received by digitizer 200, and/or as would be understood by persons skilled in the relevant art(s) having benefit of the present disclosure.

Thus, example signals have been described with respect to FIG. 6 for understanding operations and techniques described herein. While FIG. 6 illustrates signals for generating waveform points based on four tones, it is contemplated that embodiments may generate waveform points based on any number of tones, for example, less than 10 tones, 10 s of tones, hundreds of tones, thousands of tones and even greater, depending on the particular implementation.

In embodiments, INDEX of timing diagram 600 may be generated in various ways. For instance, FIG. 7 shows a block diagram of a circuit 700 for generating an index signal, according to an example embodiment. Circuit 700 may be a further embodiment of one or more components and/or subcomponents of digitizer 200 of FIG. 2. Circuit 700 is described below with respect to digitizer 200 of FIG. 2 and timing diagram 600 of FIG. 6. Further structural and operation examples will be apparent to persons skilled in the relevant art(s) based on the following descriptions.

Figure 7:
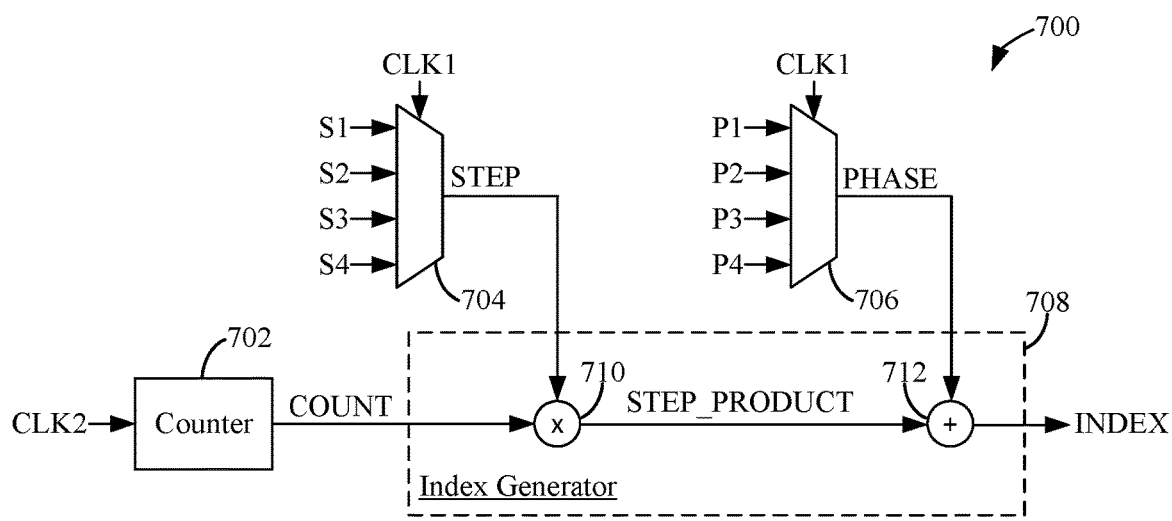
FIG. 7 is a block diagram of a circuit for generating an index signal, according to an example embodiment.

As shown in FIG. 7, circuit 700 includes a counter 702, a multiplexer 704, a multiplexer 706, and an index generator 708. Counter 702 is a further embodiment of counter 224. Counter 702 receives an input clock signal, labeled "CLK2", having a counter clock frequency, and generates count signal COUNT. As described with respect to FIG. 6, counter 702 increments COUNT with each cycle of CLK2. In some embodiments, counter 702 may be reset by a reset signal, be reset when COUNT is incremented to or past a reset threshold, and/or the like.

Multiplexer 704 receives a plurality of step values (e.g., step values S1, S2, S3, and S4) from step register(s) 238 and an input clock signal, labeled "CLK1", having a clock frequency value, and generates step signal STEP. In this way, multiplexer 704 is configured to generate STEP at a particular step value based on a cycle of CLK1. In embodiments, multiplexer 704 may be a component of noise signal generator 216, noise characteristic determiner 214, or digitizer 200.

Multiplexer 706 receives a plurality of phase values (e.g., phase values P1, P2, P3, and P4) from phase register(s) 238 and CLK1 and generates phase signal PHASE. In this way, multiplexer 706 is configured to generate PHASE at a particular step value based on a cycle of CLK1. In embodiments, multiplexer 706 may be a component of noise signal generator 216, noise characteristic determiner 214, or digitizer 200.

Index generator 708 is a further embodiment of index generator 226. As shown in FIG. 7, index generator 708 includes a multiplier 710 and an adder 712. Multiplier 710 receives COUNT from counter 702 and STEP from multiplexer 704, and generates a step product signal, labeled "STEP_PRODUCT", having a step product value. In embodiments, multiplier 710 generates the step product value of STEP_PRODUCT for a cycle of CLK1 by multiplying the count value of COUNT by the step value of STEP. Adder 712 receives STEP_PRODUCT from multiplier 710 and PHASE from multiplexer 706 and generates INDEX. Adder 712 generates an index value of INDEX for a cycle of CLK1 by summing the step product value of STEP_PRODUCT and the phase value of PHASE. For instance, with reference to timing diagram 600 of FIG. 6, during the cycle of CLK1 between to and $t_1$, multiplier 710 multiplies COUNT 1 by S1 to generate a step product value equal to the product of COUNT 1 and S1. In this example, adder 712 sums the step product value and P1 to generate I1a. In accordance with an embodiment, multiplier 710 may perform a FFT algorithm on the step value of STEP and the count value of COUNT to generate the step product value of STEP_PRODUCT.

In embodiments, TONE_PNT of timing diagram 600 may be generated in various ways. For instance, FIG. 8 shows a block diagram of a circuit 800 for generating a tone point signal, according to an example embodiment. Circuit 800 may be a further embodiment of one or more components and/or subcomponents of digitizer 200 of FIG. 2. According to an embodiment, circuit 800 may be communicatively coupled to circuit 700 of FIG. 7 to receive INDEX. Circuit 800 is described below with respect to digitizer 200 of FIG. 2 and timing diagram 600 of FIG. 6. Further structural and operation examples will be apparent to persons skilled in the relevant art(s) based on the following descriptions.

Figure 8:
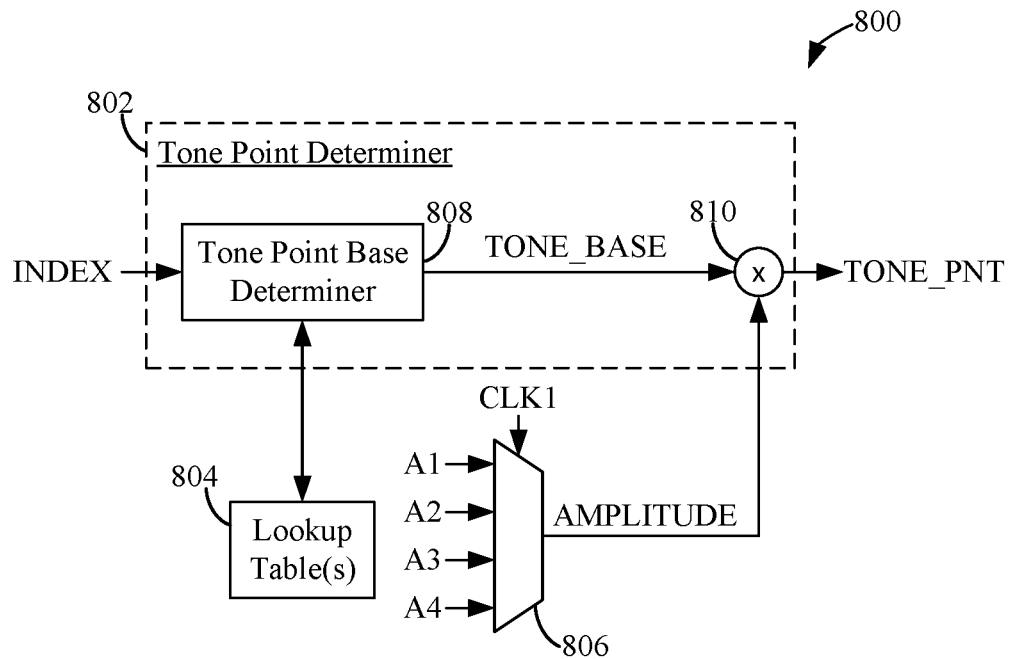
FIG. 8 is a block diagram of a circuit for generating a tone point signal, according to an example embodiment.

As shown in FIG. 8, circuit 800 includes a tone point determiner 802, one or more lookup table(s) 804, and a multiplexer 806. Lookup table(s) 804 is a further embodiment of lookup table(s) 210 of digitizer 200, in embodiments. In the context of FIG. 8, lookup table(s) 804 may store tone point base values. Lookup table(s) 804 may be created and/or updated dynamically or may be predetermined.

Multiplexer 806 receives a plurality of amplitude values (e.g., amplitude values A1, A2, A3, and A4) from amplitude register(s) 238 and CLK1, and generates amplitude signal AMPLITUDE. In this way, multiplexer 806 is configured to generate AMPLITUDE at a particular amplitude value based on a cycle of CLK1. In embodiments, multiplexer 806 may be a component of noise signal generator 216, noise characteristic determiner 214, or digitizer 200.

Tone point determiner 802 is a further embodiment of tone point determiner 228. As shown in FIG. 8, tone point determiner 802 includes a tone point base determiner 808 and a multiplier 810. Tone point base determiner 808 receives INDEX from an index generator (e.g., index generator 708 as shown in FIG. 7), interfaces with lookup table(s) 804, and generates a tone point base signal, labeled "TONE_BASE", having a tone point base value. Tone point base determiner 808 determines the tone point base value of TONE_BASE by comparing an index value of INDEX against a lookup table of lookup table(s) 804 for each cycle of CLK1. Multiplier 810 receives TONE_BASE from tone point base determiner 808 and AMPLITUDE from multiplexer 806, and generates TONE_PNT. Multiplier 810 generates a tone point value of TONE_PNT for a cycle of CLK1 by multiplying the tone point base value of TONE_BASE by the amplitude value of AMPLITUDE. For instance, with reference to timing diagram 600 of FIG. 6, during the cycle of CLK1 between to and $t_1$, tone point base determiner 808 compares I1a against lookup table(s) 804 to determine a tone point base value. In this example, multiplier 810 multiplies the determined tone point base value by A1 to generate T1a.

In embodiments, a waveform point signal may be generated in various ways. For instance, FIG. 9 shows a block diagram of a circuit 900 for generating a waveform point signal, according to an example embodiment. Circuit 900 may be a further embodiment of one or more components and/or subcomponents of digitizer 200 of FIG. 2. According to an embodiment, circuit 900 may be communicatively coupled to circuit 800 of FIG. 8 to receive TONE_PNT. Circuit 900 is described below with respect to digitizer 200 of FIG. 2 and timing diagram 600 of FIG. 6. Further structural and operation examples will be apparent to persons skilled in the relevant art(s) based on the following descriptions.

Figure 9:
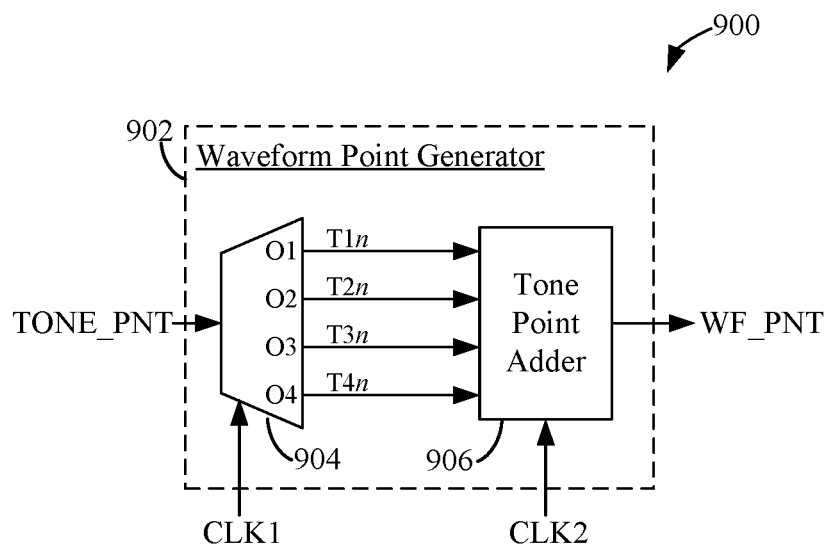
FIG. 9 is a block diagram of a circuit for generating a waveform point signal, according to an example embodiment.

As shown in FIG. 9, circuit 900 includes waveform point generator 902, which is a further embodiment of waveform point generator 230 of FIG. 2. Waveform point generator 902 includes a demultiplexer 904 and a tone point adder 906. These features of waveform point generator 902 are described in further detail as follows.

Demultiplexer 904 receives TONE_PNT from a tone point determiner (e.g., tone point determiner 802 of FIG. 8) and CLK1, and generates a plurality of tone point signals via outputs labeled "O1", "O2", "O3", and "O4". As shown in FIG. 9, tone point signals generated by demultiplexer 904 are labeled "T1n", "T2n", "T3n", and "T4n", where n represents a cycle of the counter clock frequency. In embodiments, demultiplexer 904 receives TONE_PNT and generates T1n, T2n, T3n, or T4n depending on the cycle of CLK1. For instance, with reference to timing diagram 600 of FIG. 6, demultiplexer 904 receives TONE_PNT and generates T1n having a tone point value of T1a at output O1 during the cycle of CLK1 between $t_0$ to $t_1$, generates T2n having a tone point value of T2a at output O2 during the cycle of CLK1 between $t_1$ to $t_2$, generates T3n having a tone point value of T3a at output O3 during the cycle of CLK1 between $t_2$ to $t_3$, and generates T4n having a tone point value of T4a at output O4 during the cycle of CLK1 between $t_3$ to $t_4$. In embodiments, this process repeats for each cycle of CLK2 (i.e., each increment of COUNT). In some embodiments, demultiplexer 904 may generate T1n, T2n, T3n, and T4n as analog signals. In some embodiments, demultiplexer 904 may include one or more ADCs that convert either signals received at inputs of or signals generated at outputs of demultiplexer 904 to digital data.

Tone point adder 906 receives tone point signals T1n, T2n, T3n, and T4 from demultiplexer 904 and CLK2, and generates waveform point signal WF_PNT. In this way, tone point adder 906 sums each tone point value of the received tone point signals in a cycle of CLK2 (i.e., an increment of COUNT) to generate WF_PNT for that cycle. For instance, with reference to timing diagram 600 of FIG. 6, during the cycle of CLK2 between $t_0$ and $t_4$, tone point adder 906 receives tone point signals having tone point values T1a, T2a, T3a, and T4a from demultiplexer 904, and generates waveform point WF_PNT1. In this example, tone point adder 906 sums T1a, T2a, T3a, and T4a to generate WF_PNT1. Tone point adder 906 may add tone point values in various ways. For instance, as a non-limiting example, tone point adder 906 may include a plurality of sample-and-hold circuits (not shown in FIG. 6) that sample respective signals generated by demultiplexer 904 (e.g., T1n, T2n, T3n, or T4n) and hold respective tone point values for a cycle of CLK2. In this example, tone point adder 906 sums each held tone point value to generate the waveform point for the cycle of CLK2. In another example embodiment, tone point adder 906 is a logical adder that receives T1n, T2n, T3n, and T4n as digital data from demultiplexer 904 and logically adds the tone point values to generate the waveform point WF_PNT as a digital waveform point.

As described herein, embodiments of waveform point generators such as waveform point 902 generate waveform points, which are received by an output waveform generator (e.g., output waveform generator 232). In embodiments, the output waveform generator generates a waveform as a sequence of generated waveform points. Output waveform generators such as output waveform generator 232 may generate the waveform in various ways. For example, with reference to FIG. 9, output waveform generator 232 may be a further embodiment of tone point adder 906. In this context, output waveform generator 232 generates an analog signal representative of the waveform. As described above, waveform point generator 902 may generate WF_PNT as digital data having a digital waveform point. In this context, output waveform generator 232 may include a DAC that converts the digital waveform point of WF_PNT to an analog signal representative of the waveform. In another example embodiment, output waveform generator 232 may store digital waveform points of WF_PNT in memories 208. In a non-limiting example, output waveform generator 232 may generate the waveform as a noise signal (e.g. analog noise signals 130 of FIG. 1).

Thus, embodiments of a timing diagram, a counter, an index generator, a tone point determiner, and a waveform point generator have been described with respect to FIGS. 6-9. Circuit 700, circuit 800, and circuit 900 provide for efficient multi-tone noise waveform generation. Such embodiments provide for reduced circuitry relative to conventional techniques. For example, a waveform generator may calculate index values and determine tone point values using the same circuitry/logic for each tone of the multi-tone waveform, rather than each tone having its own circuitry/logic, thereby reducing a quantity of electrical circuits needed, an amount of used circuit area, and costs.

Figure 10A:
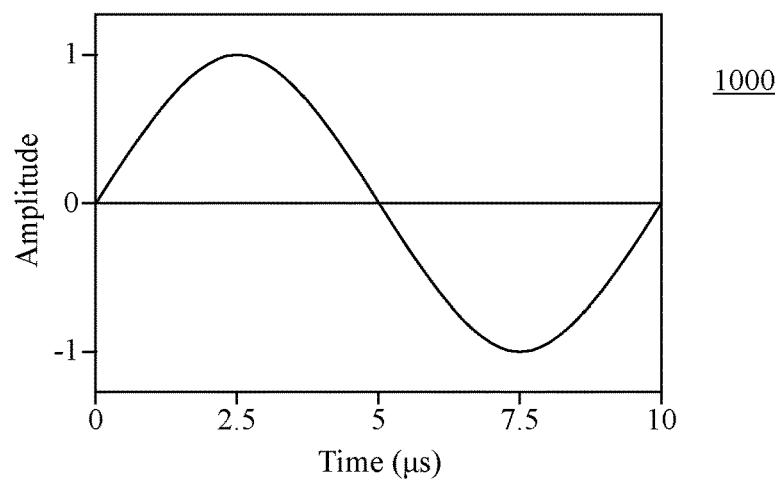
FIG. 10A is a graph of a first tone, according to an example embodiment.
Figure 10B:
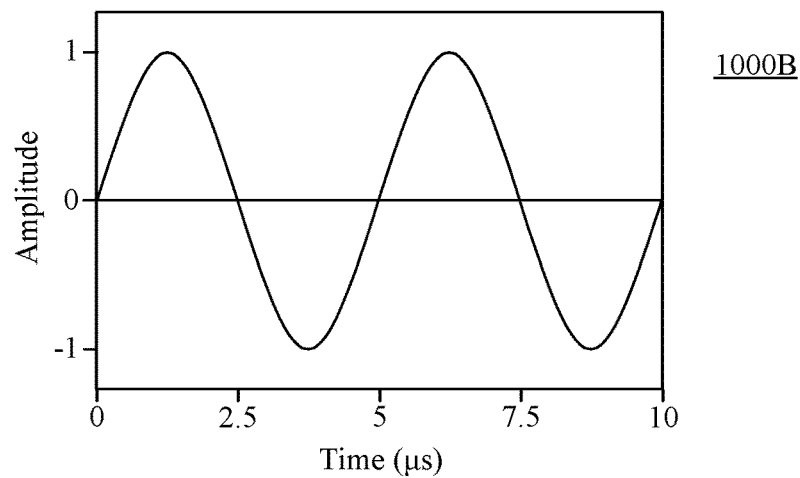
FIG. 10B is a graph of a second tone, according to an example embodiment.
Figure 10C:
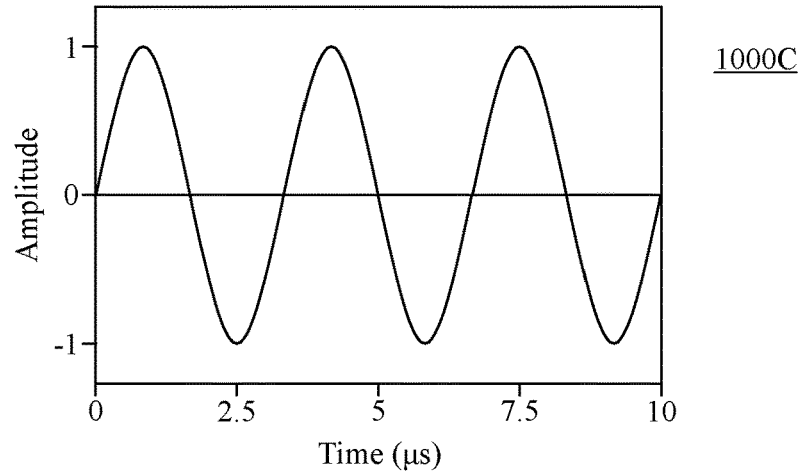
FIG. 10C is a graph of a third tone, according to an example embodiment.
Figure 10D:
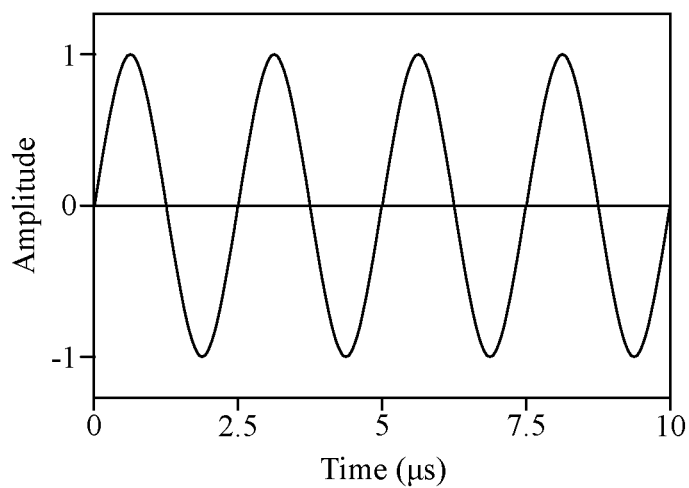
FIG. 10D is a graph of a fourth tone, according to an example embodiment.
Figure 10E:
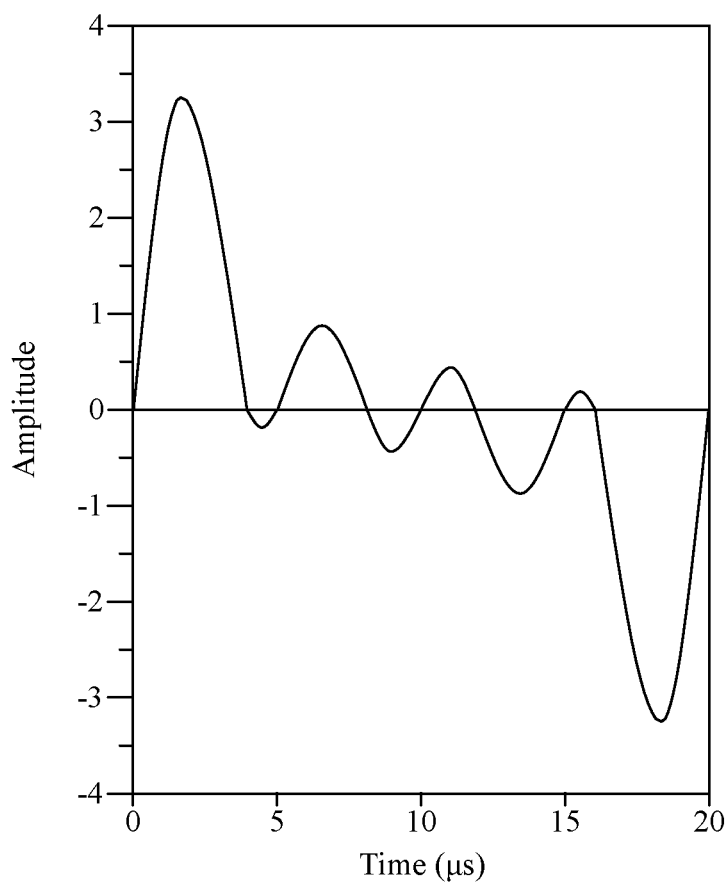
FIG. 10E is a graph of a waveform generated from four tones, according to an example embodiment.

As described above, embodiments of waveform generators such as noise signal generator 216 of digitizer 200 as shown in FIG. 2 may generate multi-tone waveforms from multiple tones. An example of the generation of a multi-tone waveform is illustrated with reference to FIGS. 10A-10E. In particular, FIGS. 10A-10D show graphs 1000A-1000D of a first tone, a second tone, a third tone, and a fourth tone, respectively, and FIG. 10E shows a graph 1000E of a waveform generated from tones 1000A-1000D. Further structural and operational embodiments will be apparent to persons skilled in the relevant art(s) based on the following description.

Referring to FIGS. 10A-10D, in graphs 1000A-1000D, the horizontal axis represents time in microseconds and the vertical axis represents amplitude of respective tones. Graph 1000A shows a sine wave of a 100 kHz tone, graph 1000B shows a sine wave of a 200 kHz tone, graph 1000C shows a sine wave of a 300 kHz tone, and graph 1000D shows a sine wave of a 400 kHz tone. As shown in FIGS. 10A-10D, each tone in graphs 1000A-1000D has an amplitude of 1. In embodiments, points of each tone of graphs 1000A-1000D may be determined by a tone point determiner (e.g., tone point determiner 228 of FIG. 2 or tone point determiner 802 of FIG. 8) using various techniques described herein. For instance, with reference to FIGS. 2 and 6, noise characteristic determiner 214 of digitizer 200 may generate a step values S1, S2, S3, and S4, phase values P1, P2, P3, and P4, and amplitude values A1, A2, A3, and A4 each corresponding to a respective tone of graphs 1000A-1000D. Counter 224 generates COUNT having a count value of COUNT 1. Index generator 226 calculates I1$a$ from S1, Pb, and COUNT 1, calculates I2$a$ from S2, P2, and COUNT 1, calculates I3$a$ from S3, P3, and COUNT 1, and calculates I4$a$ from S4, P4, and COUNT 1. In this example, tone point determiner 228 determines T1$a$ corresponding to a point of the tone of graph 1000A based on I1$a$, T2$a$ corresponding to a point of the tone of graph 1000B based on I2$a$, T3$a$ corresponding to a point of the tone of graph 1000C based on I3$a$, and T4$a$ corresponding to a point of the tone of graph 1000D based on I4$a$. In this non-limiting example, amplitude values A1, A2, A3, and A4 are equal to 1; however, other implementations of embodiments may have various amplitude values for respective tones.

Referring to FIG. 10E, in graph 1000E, the horizontal axis represents time in microseconds and the vertical axis represents amplitude of the waveform. It should be understood that the waveform of graph 1000E is approximate and not drawn to scale. In embodiments, points of the waveform of graph 1000E may be generated by a waveform point generator (e.g., waveform point generator 230 of FIG. 2 or waveform point generator 902 of FIG. 9) using various techniques described herein. For instance, with respect to the example described above with reference to FIGS. 2 and 6, waveform point generator 230 may sum T1$a$, T2$a$, T3$a$, and T4$a$ to generate WF_PNT1 corresponding to a point of the waveform of graph 1000E.

Thus, an example waveform generated from multiple tones has been illustrated and described with respect to FIGS. 10A-10E. Note that while the example illustrations and descriptions are with respect to a waveform generated from four tones, embodiments of waveform generators described herein may generate waveforms from any number of tones, e.g., fewer than ten tones, tens of tones, hundreds of tones, thousands of tones and even greater, depending on the particular implementation.

III. Example Touch Screen Device Embodiments

As described above, waveform generators may be configured in various ways to perform their described functions. For instance, a waveform generator may be configured as a noise signal generator of a digitizer in a touch screen device. A touch screen device may include, but not be limited to, a tablet, a touch screen computer, a mobile phone, a monitor, a personal digital assistant (PDA), a video game console, and/or the like.

In embodiments, touch screen devices may be implemented in various ways. For instance, FIG. 11 shows a computing device 1102 including a touch screen panel 1104, and a stylus 1106 suitable for using with computing device 1102. Stylus 1106 includes stylus tip 1108. Further structural and operation examples will be apparent to persons skilled in the relevant art(s) based on the following descriptions.

Computing device 1102 is a further embodiment of system 100 of FIG. 1. In this context, touch screen panel 1104 is a further embodiment of display screen 102. Touch screen panels such as touch screen panel 1104 generally include multiple antennas (e.g., antenna(s) 102) and a digitizer (e.g., digitizer 104) for detecting touch input from a finger or digital pen (e.g., stylus 1106). Digitizers may operate in various ways. For example, digitizers in the touch screen panels of mobile devices such as smart phones and tablets generally operate in a capacitive multi-touch mode using capacitive sensors. One such type of sensor is called a 'mutual capacitive' sensor that is typically formed as a matrix of antennas including transparent conductive material (e.g., Indium Tin Oxide (ITO)) arranged in parallel rows and columns, with a capacitor node created where the rows and columns overlap, deposited in layers over the top of the active pixel layers (e.g., LED, OLED or LCD layers) of a touch sensitive display. Other types of touch sensors, however, may be employed in embodiments. For example, so-called "metal mesh" sensors may be formed using copper, colloidal silver, or other suitable materials instead of ITO. Likewise, touch sensors may be incorporated directly into the electrode structures of the LCD layer ("in-cell touch panel").

Touching the surface of the touch screen panel with a finger or other conductive object induces a change in the charge storage capacity, and hence capacitance, of the capacitor nodes (i.e., overlapping layers) in the vicinity of the touch. Each capacitive node is associated with one or more pixels of the display screen that are immediately below the contact point on the screen. The change in capacitance of the capacitor nodes may be detected to determine touch location of the finger or conductive object on the touch sensitive display. The capacitance change may be detected by rapidly sampling each node by any of a variety of techniques as is known in the art.

It should be understood that although embodiments described herein may be couched in terms of capacitive touch sensors and/or TFT LCD displays, embodiments may be implemented using any suitable touch panel technology, including transparent touch technologies such as capacitance touch and projected capacitance touch (including in-cell, sensor on lens, on-cell, and other variations), and even some forms of resistive touch technologies. The underlying display can be of any type, including any type of transmissive display such as an LCD, emissive displays such as LED, microLED, and/or OLED, as well as reflective displays based on, for example, electronic paper.

Embodiments of touch sensors may be configured in various ways in embodiments. For instance, FIG. 12 shows a capacitive touch sensor 1200 ("sensor 1200" herein), according to an example embodiment. Sensor 1200 may be the touch sensor of a computing device, such as computing device 1102 in FIG. 11. Sensor 1200 is described as follows.

Sensor 1200 includes a substrate 1202, vertical antennas 1204A-1204*n* ("antennas 1204" herein), horizontal antennas 1206A-1206*n* ("antennas 1206" herein), and conductive traces 1208A-1208*n* ("traces 1208" herein). Substrate 1202 may be implemented in a variety of ways. For example, in one embodiment, substrate 1202 comprises a film or glass. In some embodiments, substrate 1200 may be optically transparent. However, other implementations of substrate 1202 may be used, as would be understood by a person of ordinary skill in the relevant art(s) having the benefit of this disclosure.

Antennas 1204 are substantially parallel to one another. Antennas 1206 are substantially parallel to one another and perpendicular to antennas 1204. In some embodiments, antennas 1204 are formed on a separate substrate from antennas 1206. While antennas 1204 and 1206 are depicted as straight lines in FIG. 12, other shapes and/or sizes of antennas may be used. For example, any of antennas 1204 and/or 1206 may be a series of one or more squares, circles, crooked lines, etc. as would be understood by a person of ordinary skill in the relevant art(s) having the benefit of this disclosure. Furthermore, while each antenna in FIG. 12 is shown to have similar lengths, it is also contemplated that antennas may have unequal lengths. For example, any of antennas 1204 and/or 1206 may be of different sizes to fit the shape of the touch screen device they are implemented in. While antennas 1204 and 1206 are described as vertical and horizontal antennas respectively, it is contemplated herein that other implementations of sensor 1200 may have different orientations of antennas.

Each of antennas 1204 and 1206 are coupled to a respective conductive trace of traces 1208. Traces 1208 may be formed from a suitable conductive material (e.g., copper, silver, gold, etc.). Traces 1208 may be used to couple antennas 1204 and 1206 to a digitizer, such as digitizer 200 of FIG. 2.

Figure 12:
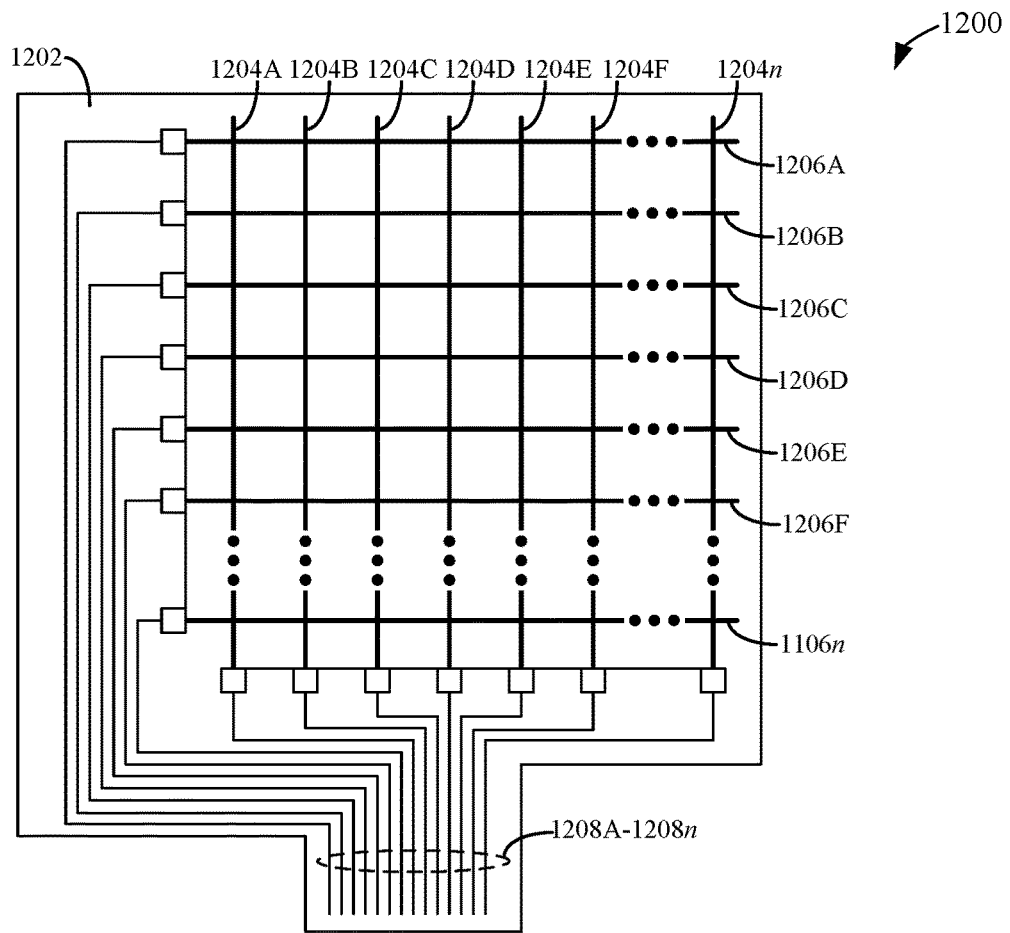
FIG. 12 depicts a capacitive touch sensor, according to an example embodiment.

Note that the variable "n" is appended to various reference numerals in FIG. 12 identifying illustrated components to indicate that the number of such components is variable, for example, with any value of 2 and greater. Note that for each distinct component/reference numeral, the variable "n" has a corresponding value, which may be different for the value of "n" for other components/reference numerals. The value of "n" for any particular component/reference numeral may be less than 10, in the 10 s, in the hundreds, in the thousands, or even greater, depending on the particular implementation.

In embodiments, sensor 1200 may be a further embodiment of receiver(s) 202 of digitizer 200 in FIG. 2. In this context, receiver(s) 202 may be configured to receive and process analog signals (e.g., noise input signals 122 and/or touch input signals 126) received from antennas 1204 and/or antennas 1206. In embodiments, analog signals received from antennas 1204 and/or antennas 1206 may represent a capacitive touch input, e.g., by a finger or digital pen (e.g., stylus 1106).

Embodiments of digitizer 200 and sensor 1200 may be configured to analyze and process signals received by digitizer 200 from sensor 1200. For instance, in a non-limiting example, digitizer 200 may be configured to determine noise characteristics from noise input signals (e.g., noise input signals 122) received from sensor 1200, generate a noise signal based on the determined noise characteristics, and filter noise from input signals (e.g., touch input signals 126) using the generated noise signal. In this context, receiver(s) 202 receives noise input signals 122 from antennas 1204 and/or antennas 1206. Noise characteristic determiner 214 receives noise input signals 122 from receiver(s) 202 and analyzes each noise input signal to generate corresponding noise characteristics (e.g., step values, phase values, and/or amplitude values). In embodiments, noise input signals 122 analyzed by noise characteristic determiner 214 may represent analog signals from antennas 1204 and/or antennas 1206 when no capacitive touch input is sensed by sensor 1200. Noise signal generator 216 receives the generated noise characteristics from noise characteristic determiner 214 and determines tone point values of tones corresponding to each step value, a respective phase value, and a respective amplitude value for each increment of a count value, according to techniques and embodiments described herein. Noise signal generator 216 generates a noise signal (e.g., as a waveform, as digital data, and/or the like, as described elsewhere herein) from the determined tone point values. In this context, the noise signal represents noise in analog signals received from sensor 1200. Noise canceler 220 may utilize the waveform generated by noise signal generator 216 to filter noise from touch input signals 126 received from sensor 1200.

For instance, when a touch input is sensed by sensor 1200, sensor 1200 may generate touch input signals 126 representative of analog signals received by antennas 1204 and/or 1206 (e.g., output signals of sensor 1200). Receiver(s) 202 receives touch input signals 126 from touch sensor 1200. Noise canceler 220 receives a touch input signal of touch input signals 126 from receiver(s) 202 and a noise signal generated by noise signal generator 216. In this context, the received noise signal is associated with the antenna associated with the touch input signal. Noise canceler 220 filters noise from the touch input signal by subtracting the noise signal from the touch input signal (e.g., via an analog or a digital signal subtraction method) to generate a noise filtered input signal. In embodiments, noise canceler 220 may receive the noise signal generated by noise signal generator 216 in various ways (e.g., from noise signal generator 216, from memories 208, from another component of digitizer 200, etc.). In embodiments, digitizer 200 may periodically analyze noise input signals (e.g., noise input signals 122) received from antennas 1204 and/or 1206 to update corresponding noise signals (e.g., waveforms representing noise in corresponding antennas of antennas 1204 and/or 1206).

Thus, embodiments of system 100, digitizer 200, and sensor 1200 provide for efficient multi-tone noise waveform generation and noise cancelation. Furthermore, the embodiments provide for reduced circuitry relative to conventional techniques. In embodiments, noise signal generator 216 may use the same circuitry/logic for determining tone point values of tones of a multi-tone waveform for an antenna of antennas 1204 and 1206, rather than each tone having its own circuitry/logic for determining tone point values, thereby reducing a quantity of electrical circuits (e.g., multiplexors, multipliers, etc.) that are present, an amount of used circuit area, and costs. Furthermore, in an embodiment where each antenna in an antenna array outputs a noise signal processed by a respective instance of noise signal generator 216, a corresponding array of noise signal generators 216 may be present. In such case, the savings in reduced circuitry and circuit area enabled by embodiments is multiplied by the number of noise signal generators 216 present.

IV. Further Example Embodiments and Advantages

As noted above, systems and devices, including digitizers, may be configured in various ways to efficiently generate multi-tone waveforms. Waveform generators have been described with respect to noise signal generators, digitizers, and touch screen devices, however it is also contemplated herein that waveform generators may be used in other applications for efficiently generating multi-tone waveforms as well. For instance, a waveform generator may be used to learn a channel frequency response. In another example embodiment, a waveform generator may be used in a frequency synthesizer. The systems and methods described herein are utilized to generate waveforms from one or more tones.

Furthermore, systems and methods have been described for filtering noise from touch input signals. For example, a digitizer in a touch screen device may include a noise canceler for filtering noise from capacitive touch input signals by subtracting a generated waveform representing noise in a signal received from an antenna of the capacitive touch sensor. While the embodiments above have been described with respect to a digitizer in a touch screen device, similar techniques may be used for filtering noise from input signals in other applications as well. For example, noise filtering techniques described herein may be used to filter noise from audio signals by subtracting a generated waveform representing noise in an audio input device (e.g., a microphone) from an audio input signal.

As noted above, systems and devices, including digitizers, may be configured in various ways to efficiently generate multi-tone waveforms representative of noise in signals received from antennas. Noise signal generators have been described with respect to generating a noise signal corresponding to noise in a respective antenna, however it is also contemplated herein that a noise signal generator may be used to generate multiple noise signals, each corresponding to noise in a respective antenna. For instance, a noise signal generator may be associated with less than ten, 10 s, hundreds, thousands, and even greater numbers of antennas, and generate corresponding noise signals, depending on the particular implementation. For example, in a touch screen device with 3,000 antennas, a digitizer may include 300 noise signal generators, each configured to generate ten noise signals corresponding to ten antennas. In embodiments of noise signal generators configured to generate multiple noise signals, a noise signal generator may generate respective waveform points for each noise signal for each increment of count. In this way, embodiments of a noise signal generator may use the same circuitry/logic for generating multi-tone waveforms from each antenna associated with the noise generator, rather than each antenna have its own circuitry/logic, thereby further reducing a quantity of electrical circuits needed, an amount of used circuit area, and costs.

Embodiments and techniques for calculating index values in various ways have been described herein. For instance, an index value may be calculated based on a count value, a step value, and a phase value. However, it is contemplated herein that index values may be calculated or determined in other ways. For instance, an index value may be calculated using the count value and either the step value or the phase value. Furthermore, multipliers have been described for multiplying the count value by the step value. Such multipliers may be implemented in various ways. For instance, a multiplier may perform a multiplication of the count value and the step value to generate a step product value as a product of the values. In accordance with another embodiment, a multiplier may perform a FFT operation based on the count value and the step value to generate a step product value in the frequency domain. In some embodiments, that index values may be determined by comparing one or more of the count value, the step value, the step product value, and/or the phase value against a lookup table (e.g., lookup table(s) 210) to determine an index value.

Systems, devices, and methods have been described for various multiplying and adding operations. Embodiments of present disclosure may use the same multiplier and/or adder circuits for various sets of count values, step values, phase values, and/or amplitude values. For example, the same multiplier may be used to multiply each count value by each step value across different cycles of the counter clock frequency and the value clock frequency. In this way, embodiments of the present disclosure may efficiently generate multi-tone waveforms.

Moreover, as described herein, the value the counter clock frequency may be lower than the value clock frequency by an amount proportionate to the number of step values in the plurality of step values. In this way, embodiments of waveform generators such as noise signal generator described herein may use the same logic circuits to generate step product values, calculate index values, determine tone point base values, and/or determine tone point values for each cycle of the value clock frequency. Furthermore, the same logic circuits may be used to generate waveform points for each cycle of the counter clock frequency. For instance, in a non-limiting example, a noise characteristic determiner determines four step values, four phase values, and four amplitude values. In this example, the value clock frequency of a value clock signal is four times faster than the counter clock frequency of a counter clock signal. In this context, an index generator may be configured to calculate an index value corresponding to a step value of the four step values and a respective phase value of the four phase values using the same logic circuits for each cycle of the value clock frequency. Further, a tone point determiner may be configured to determine a tone point value based on the calculated index value and a respective amplitude value of the four amplitude values using the same logic circuits for each cycle of the value clock frequency. Furthermore, a waveform point generator may be configured to generate a waveform point by summing each determined tone point value using the same logic circuits for each cycle of the counter clock frequency. In this context, embodiments of waveform generators may reduce circuit area and/or costs.

Moreover, according to the described embodiments and techniques, any components of waveform generators, noise signal generators, digitizers, and/or touch screen devices and their functions may be caused to be activated for operation/performance thereof based on other operations, functions, actions, and/or the like, including initialization, completion, and/or performance of the, functions, actions, and/or the like.

In some example embodiments, one or more of the operations of the flowcharts described herein may not be performed. Moreover, operations in addition to or in lieu of the operations of the flowcharts described herein may be performed. Further, in some example embodiments, one or more of the operations of the flowcharts described herein may be performed out of order, in an alternate sequence, or partially (or completely) concurrently with each other or with other operations.

The further example embodiments and advantages described in this Section may be applicable to any embodiments disclosed in this Section or in any other Section of this disclosure.

Embodiments and techniques, including methods, described herein may be performed in various ways such as, but not limited to, being implemented by hardware, or hardware combined with one or both of software and firmware.

V. Example Computer System Implementations

Display screen 102, digitizer 104, controller 106, antenna(s) 108, noise characteristic determiner 110, noise signal generator 112, noise canceler 114, digitizer 200, receiver(s) 202, registers 204, processor(s) 206, memories 208, lookup table(s) 210, communication interface 212, noise characteristic determiner 214, noise signal generator 216, noise canceler 220, counter 224, index generator 226, tone point determiner 228, waveform point generator 230, output waveform generator 232, step register(s) 234, phase register(s) 236, amplitude register(s) 238, circuit 700, counter 702, multiplexer 704, multiplexer 706, index generator 708, multiplier 710, adder 712, circuit 800, tone point determiner 802, lookup table(s) 804, multiplexer 806, tone point base determiner 808, multiplier 810, circuit 900, waveform point generator 902, demultiplexer 904, tone point adder 906, computing device 1102, stylus 1106, touch sensor 1200, antennas 1204, antennas 1206, flowchart 300, flowchart 320, flowchart 330, flowchart 400, and/or flowchart 500 may be implemented in hardware, or hardware with any combination of software and/or firmware, including being implemented as computer program code configured to be executed in one or more processors and stored in a computer readable storage medium, or being implemented as hardware logic/electrical circuitry, such as being implemented in a system-on-chip (SoC). The SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

Figure 13:
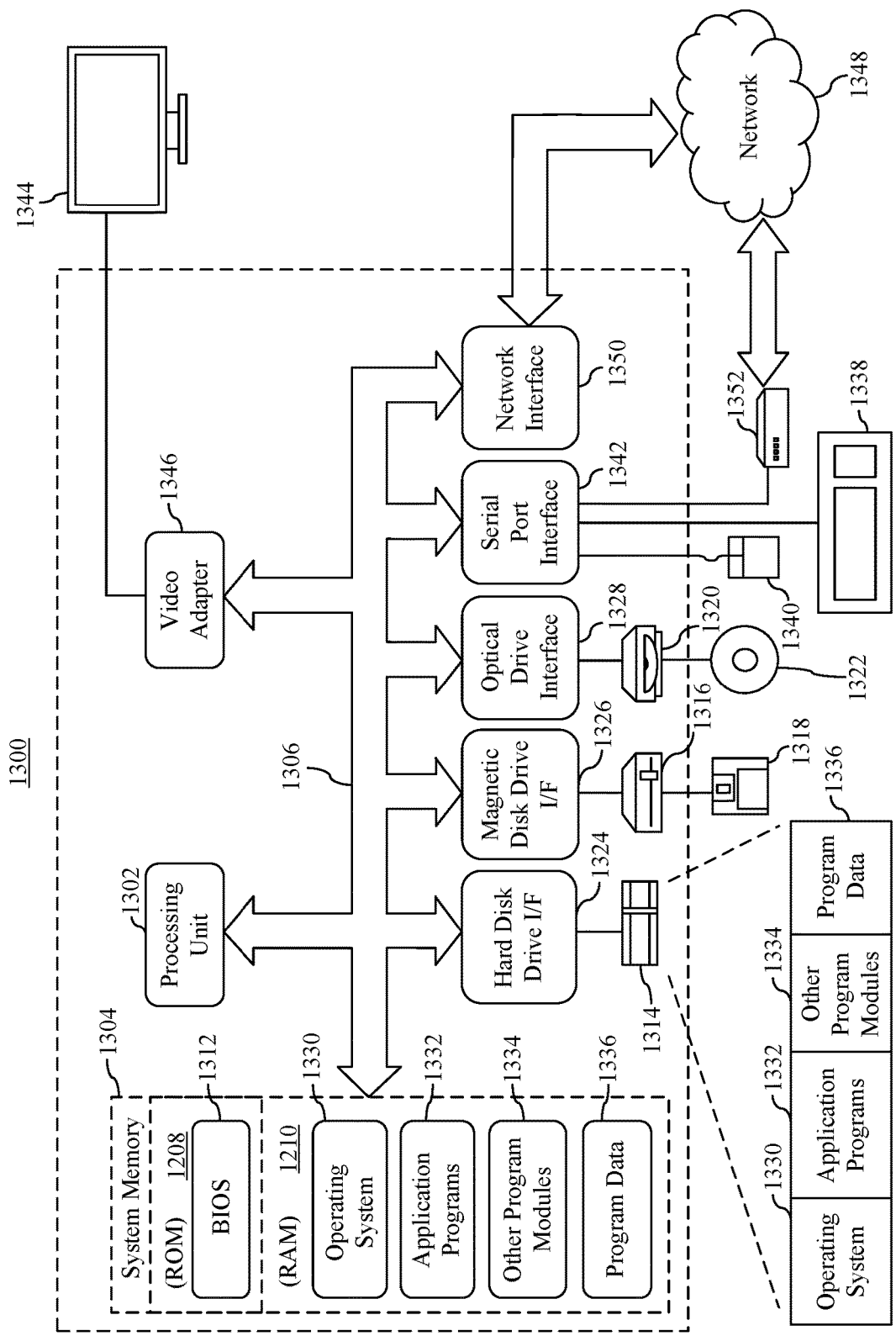
FIG. 13 is a block diagram of an example processor-based computer system that may be used to implement various embodiments.

FIG. 13 depicts an exemplary implementation of a computing device 1300 in which embodiments may be implemented. For example, computing device 1300 may be used to implement display screen 102, digitizer 104, and/or controller 106, as described above in reference to FIG. 1. Computing device 1300 may also be used to implement digitizer 200, as described above in reference to FIG. 2. Computing device 1300 may also be used to implement counter 702, multiplexer 704, multiplexer 706, and/or index generator, as described above in reference to FIG. 7. Computing device 1300 may also be used to implement tone point determiner 802, lookup table(s) 804, and/or multiplexer 806, as described above in reference to FIG. 8. Computing device 1300 may also be used to implement waveform point generator 902, as described above in reference to FIG. 9. Computing device 1300 may also be used to implement computing device 1102 and/or stylus 1106, as described above in reference to FIG. 11. Computing device 1300 may also be used to implement touch sensor 1200, as described in reference to FIG. 12. Computing device 1300 may also be used to implement any of the steps of any of the flowcharts of FIGS. 3-5, as described above. Computing device 1300 may also be used to implement any analyses, determinations, calculations, generations, storage, and/or the like associated with diagram 600 of FIG. 6 and/or graphs 1000A-1000E of FIGS. 10A-10E. The description of computing device 1300 provided herein is provided for purposes of illustration and is not intended to be limiting. Embodiments may be implemented in further types of computer systems, as would be known to persons skilled in the relevant art(s).

As shown in FIG. 13, computing device 1300 includes one or more processors, referred to as processor unit 1302, a system memory 1304, and a bus 1306 that couples various system components including system memory 1304 to processor circuit 1302. Processor unit 1302 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor unit 1302 may execute program code stored in a computer readable medium, such as program code of operating system 1330, application programs 1332, other programs 1334, etc. Bus 1306 represents one or more of any of several types of bus structures, including a memory bus or memory controller, a peripheral bus, an accelerated graphics port, and a processor or local bus using any of a variety of bus architectures. System memory 1304 includes read only memory (ROM) 1308 and random-access memory (RAM) 1310. A basic input/output system 1312 (BIOS) is stored in ROM 1308.

Computing device 1300 also has one or more of the following drives: a hard disk drive 1314 for reading from and writing to a hard disk, a magnetic disk drive 1316 for reading from or writing to a removable magnetic disk 1318, and an optical disk drive 1320 for reading from or writing to a removable optical disk 1322 such as a CD ROM, DVD ROM, or other optical media. Hard disk drive 1314, magnetic disk drive 1316, and optical disk drive 1320 are connected to bus 1306 by a hard disk drive interface 1324, a magnetic disk drive interface 1326, and an optical drive interface 1328, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards and drives (e.g., solid state drives (SSDs)), digital video disks, RAMs, ROMs, and other hardware storage media.

A number of program modules or components may be stored on the hard disk, magnetic disk, optical disk, ROM, or RAM. These program modules include an operating system 1330, one or more application programs 1332, other program modules 1334, and program data 1336. In accordance with various embodiments, the program modules may include computer program logic that is executable by processing unit 1302 to perform any or all the functions and features of digitizer 104, controller 106, noise characteristic determiner 110, noise signal generator 112, noise canceler 114, digitizer 200, receiver(s) 202, processor(s) 206, communication interface 212, noise characteristic determiner 214, noise signal generator 216, noise canceler 220, counter 224, index generator 226, tone point determiner 228, waveform point generator 230, output waveform generator 232, circuit 700, counter 702, multiplexer 704, multiplexer 706, index generator 708, multiplier 710, adder 712, circuit 800, tone point determiner 802, multiplexer 806, tone point base determiner 808, multiplier 810, circuit 900, waveform point generator 902, demultiplexer 904, tone point adder 906, computing device 1102, stylus 1106, touch sensor 1200, flowchart 300, flowchart 320, flowchart 330, flowchart 400, flowchart 500, and/or timing diagram 600 (including any steps of flowcharts 300, 320, 330, 400, and/or 500).

A user may enter commands and information into the computing device 1300 through input devices such as keyboard 1338 and pointing device 1340. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to processor unit 1302 through a serial port interface 1342 that is coupled to bus 1306, but may be connected by other interfaces, such as a parallel port, game port, or a universal serial bus (USB).

A display screen 1344 is also connected to bus 1306 via an interface, such as a video adapter 1346. Display screen 1344 may be external to, or incorporated in, computing device 1300. For example, display screen 1344 may be display screen 102 of FIG. 1, touch screen panel 1104 of FIG. 11, and/or the like. Display screen 1344 may display information, as well as being a user interface for receiving user commands and/or other information (e.g., by touch, finger gestures, virtual keyboard, etc.). In addition to display screen 1344, computing device 1300 may include other peripheral output devices (not shown) such as speakers and printers.

Computing device 1300 is connected to a network 1348 (e.g., the Internet) through an adaptor or network interface 1350, a modem 1352, or other means for establishing communications over the network. Modem 1352, which may be internal or external, may be connected to bus 1306 via serial port interface 1342, as shown in FIG. 13, or may be connected to bus 1306 using another interface type, including a parallel interface.

As used herein, the terms "computer program medium," "computer-readable medium," and "computer-readable storage medium" are used to refer to physical hardware media such as the hard disk associated with hard disk drive 1314, removable magnetic disk 1318, removable optical disk 1322, other physical hardware media such as RAMs, ROMs, flash memory cards, digital video disks, zip disks, MEMs, nanotechnology-based storage devices, and further types of physical/tangible hardware storage media. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media that are separate and non-overlapping with embodiments directed to computer-readable storage media.

As noted above, computer programs and modules (including application programs 1332 and other programs 1334) may be stored on the hard disk, magnetic disk, optical disk, ROM, RAM, or other hardware storage medium. Such computer programs may also be received via network interface 1350, serial port interface 1342, or any other interface type. Such computer programs, when executed or loaded by an application, enable computing device 1300 to implement features of embodiments described herein. Accordingly, such computer programs represent controllers of the computing device 1300.

Embodiments are also directed to computer program products comprising computer code or instructions stored on any computer-readable medium. Such computer program products include hard disk drives, optical disk drives, memory device packages, portable memory sticks, memory cards, and other types of physical storage hardware. In accordance with various embodiments, the program modules may include computer program logic that is executable by processing unit 1302 to perform any or all of the functions and features of display screen 102, digitizer 104, and/or controller 106 as described above in reference to FIG. 1, digitizer 200 of FIG. 2, circuit 700 of FIG. 7, circuit 800 of FIG. 8, circuit 900 of FIG. 9, computing device 1102 and/or stylus 1106 as described in reference to FIG. 11, and/or touch sensor 1200 of FIG. 12. The program modules may also include program logic that, when executed by processing unit 1302, causes processing unit 1302 to perform any of the steps of any of the flowcharts of FIGS. 3-5, as described above.

VI. Additional Exemplary Embodiments

In an embodiment, a waveform generator comprises a counter, an index generator, a tone point determiner, a waveform point generator, and an output waveform generator. The counter is configured to generate a count signal having a count value. The index generator is configured to receive the count signal, a plurality of step values, and a plurality of phase values. For each increment of the count value, the index generator is configured to calculate an index value corresponding to each step value of the plurality of step values based on the step value, the count value, and a respective phase value of the plurality of phase values. The tone point determiner is configured to, for each increment of the count value, determine a tone point value corresponding to each calculated index value to generate a plurality of tone point values. The waveform point generator is configured to, for each increment of the count value, sum the plurality tone point values to generate a corresponding waveform point. The output waveform generator is configured to generate a waveform as a sequence of generated waveform points.

In an embodiment, the index generator is configured to calculate the index value corresponding to each step value by, for each step value, multiplying the step value by the count value to generate a step product value and summing the step product value and the respective phase value to generate the calculated index value.

In an embodiment, the tone point determiner is configured to determine the tone point value corresponding to each calculated index value by, for each calculated index value, determining a tone point base value corresponding to the calculated index value and multiplying the tone point base value by a corresponding amplitude value to generate the determined tone point value.

In an embodiment, tone point base values are stored in a look-up table.

In an embodiment, the plurality of step values is received as a multiplexed step value signal. The multiplexed step value signal switches between the plurality of step values at a first frequency. The counter generates the count signal at a second frequency lower than the first frequency by an amount proportionate to the number of step values in the plurality of step values.

In an embodiment, the output waveform generator is a digital-to-analog converter.

In an embodiment, a method for generating a waveform is performed. The method includes generating a count signal having a count value. A plurality of step values and a plurality of phase values are received. For each increment of the count value, an index value corresponding to each step value of the plurality of step values is calculated based on the step value, the count value, and a respective phase value of the plurality of phase values. For each increment of the count value, a tone point value corresponding to each calculated index value is determined to generate a plurality of tone point values. For each increment of the count value, the determined tone point values are summed to generate a corresponding waveform point. A waveform is generated as a sequence of generated waveform points.

In an embodiment, the generated waveform represents noise on at least one antenna. The method further includes receiving an input signal representative of at least one signal from the at least one antenna. The waveform is subtracted from the input signal to generate a noise filtered input signal.

In an embodiment, the input signal represents an output signal generated by a capacitive touch sensor.

In an embodiment, the index value is calculated by, for each step value, multiplying the step value by the count value to generate a step product value and summing the step product value and the respective phase value to generate the calculated index value.

In an embodiment, the tone point value is determined by, for each calculated index value, determining a tone point base value corresponding to the calculated index value. The tone point base value is multiplied by a corresponding amplitude value to generate the determined tone point value.

In an embodiment, a plurality of analog signals are received. The received plurality of analog signals are analyzed to determine the plurality of step values, the plurality of phase values, and a plurality of amplitude values corresponding to the plurality of analog signals.

In an embodiment, the plurality of step values is received as a multiplexed signal.

In an embodiment, the multiplexed step value signal switches between the plurality of step values at a first frequency. The count signal is generated at a second frequency lower than the first frequency by an amount proportionate to the number of step values in the plurality of step values.

In an embodiment, a digitizer includes a noise characteristic determiner and a waveform generator. The noise characteristic determiner is configured to determine a plurality of step values and a plurality of phase values corresponding to a plurality of received analog signals. The waveform generator is configured to receive the plurality of step values and the plurality of phase values and generate a count signal having a count value. For each increment of the count value, the waveform generator is configured to calculate an index value corresponding to each step value of the plurality of step values based on the step value, the count value, and a respective phase value of the plurality of phase values. For each increment of the count value, the waveform generator is configured to determine a tone point value corresponding to each calculated index value to generate a plurality of tone point values. For each increment of the count value, the waveform generator is configured to sum the determined tone point values to generate a corresponding waveform point. The waveform generator is configured to generate a waveform as a sequence of generated waveform points.

In an embodiment, a noise canceler is configured to receive an input signal corresponding to at least one signal from at least one antenna and subtract the waveform from the input signal to generate a noise filtered input signal.

In an embodiment, the waveform generator is configured to calculate the index value corresponding to each step value by, for each step value, multiplying the step value by the count value to generate a step product value and summing the step product value and the respective phase value to generate the calculated index value.

In an embodiment, the waveform generator is configured to determine the tone point value corresponding to each calculated index value by, for each calculated index value, determining a tone point base value corresponding to each calculated index value. The tone point base value is multiplied by a corresponding amplitude value to generate the determined tone point value.

In an embodiment, the noise characteristic determiner is configured to determine a plurality of amplitude values corresponding to the plurality of received analog signals.

In an embodiment, the noise characteristic determiner includes a multiplexer that receives the plurality of step values and generates a multiplexed step value signal that is received by the waveform generator. The multiplexed step value signal switches between the plurality of step values at a first frequency. The waveform generator is configured to generate the count signal at a second frequency lower than the first frequency by an amount proportionate to the number of step values in the plurality of step values.

VII. CONCLUSION

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A waveform generator, comprising:
   a counter configured to generate a count signal having a count value;
   an index generator configured to receive the count signal, a plurality of step values, and a plurality of phase values, each step value representative of a frequency of a corresponding tone, and for each increment of the count value, calculate an index value corresponding to each step value of the plurality of step values based on the step value, the count value, and a respective phase value of the plurality of phase values;
   a tone point determiner configured to, for each increment of the count value, determine a tone point value corresponding to each calculated index value to generate a plurality of tone point values;
   a waveform point generator configured to, for each increment of the count value, sum the plurality tone point values to generate a corresponding waveform point; and
   an output waveform generator configured to generate a waveform as a sequence of generated waveform points.

2. The waveform generator of claim 1, wherein the index generator is configured to calculate the index value corresponding to each step value by:
   for each step value,
      multiplying the step value by the count value to generate a step product value; and
      summing the step product value and the respective phase value to generate the calculated index value.

3. The waveform generator of claim 1, wherein:
the plurality of step values is received as a multiplexed step value signal, and the multiplexed step value signal switches between the plurality of step values at a first frequency; and
the counter generates the count signal at a second frequency lower than the first frequency by an amount proportionate to the number of step values in the plurality of step values.

4. The waveform generator of claim 1, wherein the output waveform generator is a digital-to-analog converter.

5. The waveform generator of claim 1, wherein the tone point determiner is configured to determine the tone point value corresponding to each calculated index value by:
for each calculated index value,
determining a tone point base value corresponding to the calculated index value; and
multiplying the tone point base value by a corresponding amplitude value to generate the determined tone point value.

6. The waveform generator of claim 5, wherein the tone point base values are stored in a look-up table.

7. A method for generating a waveform, comprising:
generating a count signal having a count value;
receiving a plurality of step values and a plurality of phase values, each step value representative of a frequency of a corresponding tone;
for each increment of the count value:
calculating an index value corresponding to each step value of the plurality of step values based on the step value, the count value, and a respective phase value of the plurality of phase values;
determining a tone point value corresponding to each calculated index value to generate a plurality of tone point values; and
summing the determined tone point values to generate a corresponding waveform point; and
generating a waveform as a sequence of generated waveform points.

8. The method of claim 7, wherein said calculating an index value comprises:
for each step value,
multiplying the step value by the count value to generate a step product value; and
summing the step product value and the respective phase value to generate the calculated index value.

9. The method of claim 7, wherein said determining a tone point value comprises:
for each calculated index value,
determining a tone point base value corresponding to the calculated index value; and
multiplying the tone point base value by a corresponding amplitude value to generate the determined tone point value.

10. The method of claim 7, further comprising:
receiving a plurality of analog signals;
analyzing the received plurality of analog signals to determine the plurality of step values, the plurality of phase values, and a plurality of amplitude values corresponding to the plurality of analog signals.

11. The method of claim 7, wherein the generated waveform represents noise on at least one antenna, the method further comprising:
receiving an input signal representative of at least one signal from the at least one antenna; and
subtracting the waveform from the input signal to generate a noise filtered input signal.

12. The method of claim 11, wherein the input signal represents an output signal generated by a capacitive touch sensor.

13. The method of claim 7, wherein the plurality of step values is received as a multiplexed signal.

14. The method of claim 13, wherein:
the multiplexed step value signal switches between the plurality of step values at a first frequency; and
the count signal is generated at a second frequency lower than the first frequency by an amount proportionate to the number of step values in the plurality of step values.

15. A digitizer, comprising:
a noise characteristic determiner configured to determine a plurality of step values and a plurality of phase values corresponding to a plurality of received analog signals, each step value of the plurality of step values corresponding to a frequency of a respective one of the plurality of received analog signals;
a waveform generator configured to
receive the plurality of step values and the plurality of phase values;
generate a count signal having a count value;
for each increment of the count value:
calculate an index value corresponding to each step value of the plurality of step values based on the step value, the count value, and a respective phase value of the plurality of phase values;
determine a tone point value corresponding to each calculated index value to generate a plurality of tone point values; and
sum the determined tone point values to generate a corresponding waveform point; and
generate a waveform as a sequence of generated waveform points.

16. The digitizer of claim 15, further comprising a noise canceler configured to:
receive an input signal corresponding to at least one signal from at least one antenna; and
subtract the waveform from the input signal to generate a noise filtered input signal.

17. The digitizer of claim 15, wherein the waveform generator is configured to calculate the index value corresponding to each step value by:
for each step value,
multiplying the step value by the count value to generate a step product value; and
summing the step product value and the respective phase value to generate the calculated index value.

18. The digitizer of claim 15, wherein the waveform generator is configured to determine the tone point value corresponding to each calculated index value by:
for each calculated index value,
determining a tone point base value corresponding to each calculated index value; and
multiplying the tone point base value by a corresponding amplitude value to generate the determined tone point value.

19. The digitizer of claim 15, wherein the noise characteristic determiner is configured to determine a plurality of amplitude values corresponding to the plurality of received analog signals.

20. The digitizer of claim 15, wherein:
the noise characteristic determiner comprises a multiplexer that receives the plurality of step values and generates a multiplexed step value signal that is received by the waveform generator, wherein the multiplexed step value signal switches between the plurality of step values at a first frequency; and the waveform generator configured to generate the count signal at a second frequency lower than the first frequency by an amount proportionate to the number of step values in the plurality of step values.

* * * * *